US009159756B2

(12) United States Patent
Kokubun et al.

(10) Patent No.: US 9,159,756 B2
(45) Date of Patent: Oct. 13, 2015

(54) SOLID-STATE IMAGING DEVICE AND MANUFACTURING METHOD OF THE SAME

(71) Applicant: KABUSHIKI KAISHA TOSHIBA, Minato-ku, Tokyo (JP)

(72) Inventors: Koichi Kokubun, Yokohama (JP); Yoshitaka Egawa, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/293,732

(22) Filed: Jun. 2, 2014

(65) Prior Publication Data

US 2015/0206911 A1    Jul. 23, 2015

(30) Foreign Application Priority Data

Jan. 21, 2014    (JP) .................................. 2014-008958

(51) Int. Cl.
*H01L 27/146*    (2006.01)

(52) U.S. Cl.
CPC .... *H01L 27/14621* (2013.01); *H01L 27/14627* (2013.01); *H01L 27/14647* (2013.01); *H01L 27/14685* (2013.01); *H01L 27/14689* (2013.01)

(58) Field of Classification Search
CPC ................ H01L 27/14621; H01L 27/14625; H01L 27/14641; H01L 27/14685; H01L 31/02162; H01L 31/02327
See application file for complete search history.

(56) References Cited

U.S. PATENT DOCUMENTS

| 7,863,633 | B2* | 1/2011 | Kato | 257/98 |
| 2013/0181113 | A1* | 7/2013 | Egawa | 250/208.1 |
| 2013/0182155 | A1* | 7/2013 | Egawa | 348/294 |
| 2013/0240708 | A1* | 9/2013 | Kokubun | 250/208.1 |
| 2014/0021574 | A1* | 1/2014 | Egawa | 257/432 |

FOREIGN PATENT DOCUMENTS

| JP | 2007-282054 A | 10/2007 |
| JP | 2008-060323 A | 3/2008 |
| JP | 2013-143738 A | 7/2013 |
| JP | 2013-191717 A | 9/2013 |
| JP | 2014-023118 A | 2/2014 |

* cited by examiner

*Primary Examiner* — Jaehwan Oh
(74) *Attorney, Agent, or Firm* — Holtz, Holtz, Goodman & Chick PC

(57) ABSTRACT

According to one embodiment, there is a solid-state imaging device including an imaging region. In the imaging region, a plurality of pixels are arranged two-dimensionally. A first inclination angle of a light incidence surface of a dichroic filter in a first pixel among the plurality of pixels relative to a normal to a surface of a semiconductor substrate and a second inclination angle of a light incidence surface of a dichroic filter in a second pixel located farther from a center of the imaging region than the first pixel among the plurality of pixels relative to the normal are decided on so as to make, for light incident on the imaging region, a filter property of the dichroic filter in the first pixel and a filter property of the dichroic filter in the second pixel equalized.

20 Claims, 21 Drawing Sheets

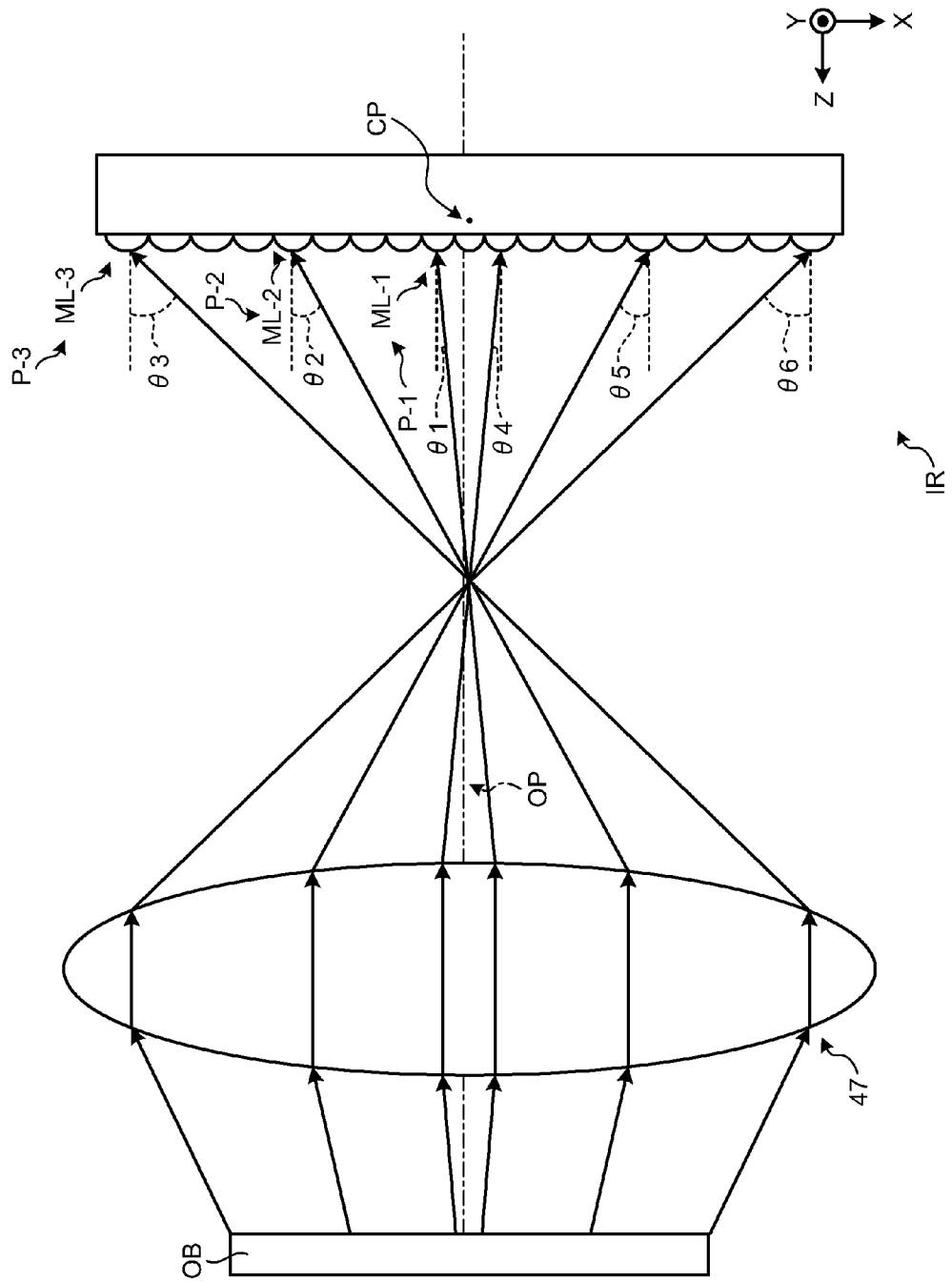

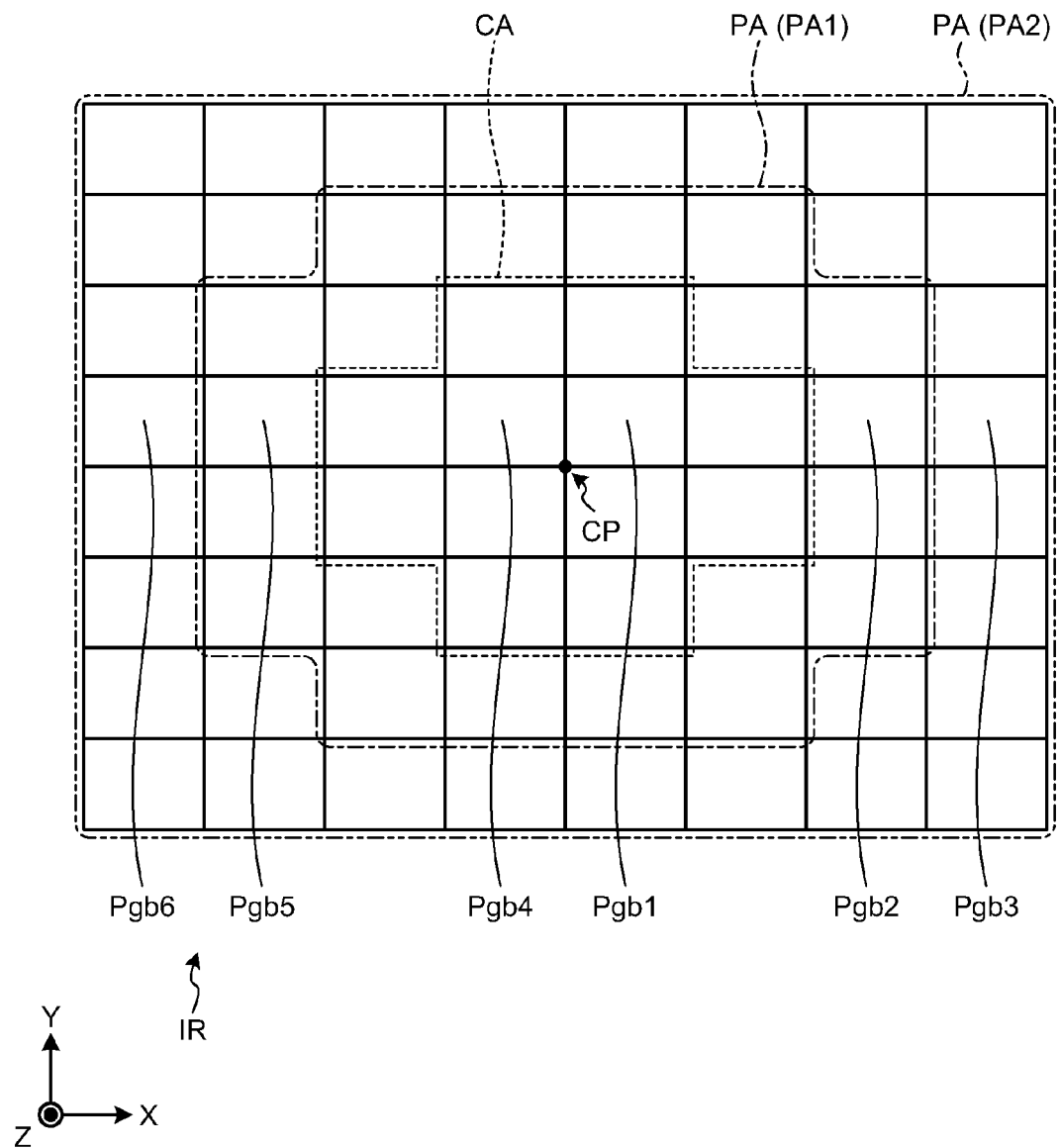

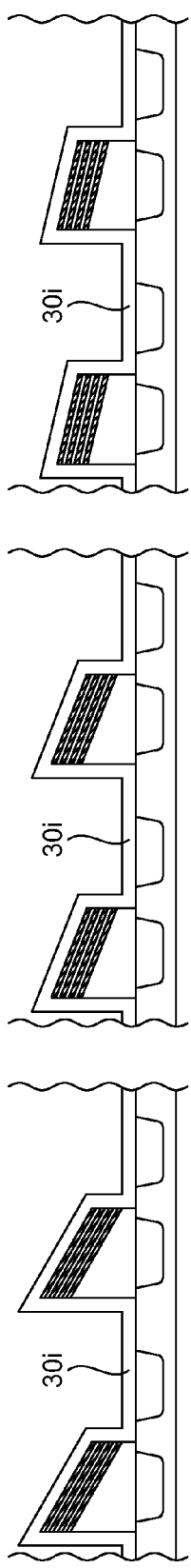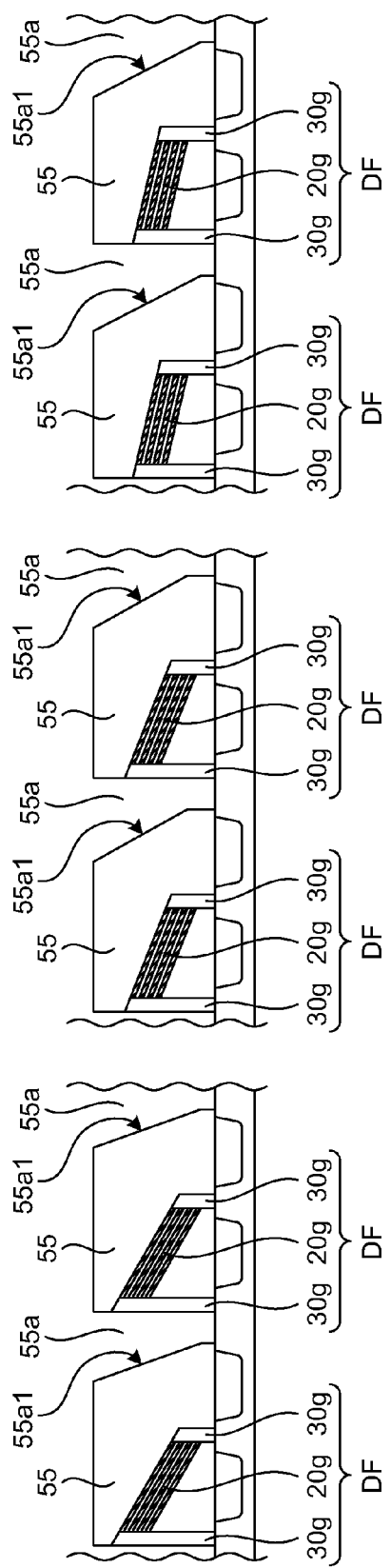

FIG.21A
FIG.21B
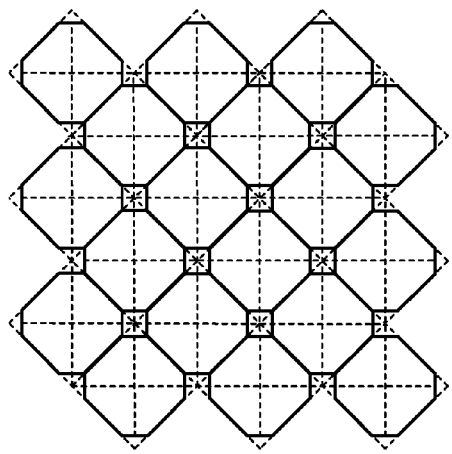
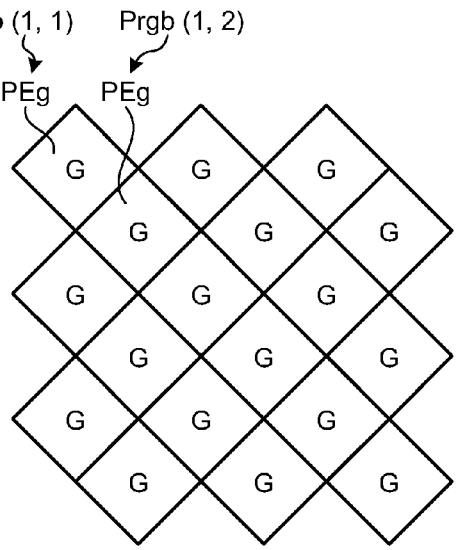
FIG.21C
FIG.21D
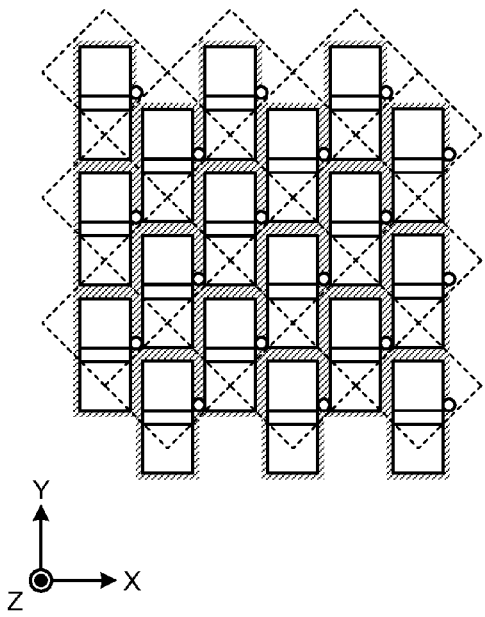
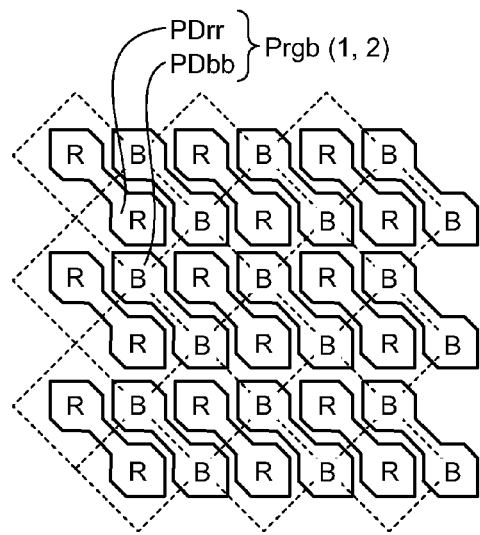

US 9,159,756 B2

SOLID-STATE IMAGING DEVICE AND MANUFACTURING METHOD OF THE SAME

CROSS-REFERENCE TO RELATED APPLICATIONS

This application is based upon and claims the benefit of priority from Japanese Patent Application No. 2014-008958, filed on Jan. 21, 2014; the entire contents of which are incorporated herein by reference.

FIELD

Embodiments described herein relate generally to a solid-state imaging device.

BACKGROUND

In an imaging system such as a camera, a solid-state imaging device is placed at a predicted image plane of an imaging lens. The imaging lens forms an image of an object on the imaging region (image plane) of the solid-state imaging device. The solid-state imaging device generates an image signal according to the object image. At this time, if the amounts of received light of pixels in the periphery attenuate relative to pixels near the center in the imaging region, there may occur shading where pixel signals in the periphery of the imaging region attenuate in luminance (signal level) relative to pixel signals in the vicinity of the center of the imaging region, in the image signal generated by the solid-state imaging device.

BRIEF DESCRIPTION OF THE DRAWINGS

FIG. 4 is diagram showing the incident angle of a chief ray to each pixel in the first embodiment;

FIG. 8 is a diagram showing the positions of pixels in the imaging region in the first embodiment;

FIGS. 13A and 13B are diagrams showing the manufacturing method of the solid-state imaging device according to the first embodiment;

FIGS. 21A to 21D are diagrams showing the arrangements of a plurality of pixels in another modified example of the second embodiment.

DETAILED DESCRIPTION

In general, according to one embodiment, there is a solid-state imaging device including an imaging region. In the imaging region, a plurality of pixels are arranged two-dimensionally. Each of the plurality of pixels corresponds to at least two colors. Each of the plurality of pixels includes a first photoelectric conversion portion, a second photoelectric conversion portion, a micro-lens, and a dichroic filter. The dichroic filter transmits light of a first color out of light having passed through the micro-lens to guide the light of the first color to the first photoelectric conversion portion. The dichroic filter reflects light of a second color to guide the light of the second color to the second photoelectric conversion portion. A first inclination angle of a light incidence surface of the dichroic filter in a first pixel among the plurality of pixels relative to a normal to a surface of a semiconductor substrate and a second inclination angle of a light incidence surface of the dichroic filter in a second pixel located farther from a center of the imaging region than the first pixel among the plurality of pixels relative to the normal are decided on so as to make, for light incident on the imaging region, a filter property of the dichroic filter in the first pixel and a filter property of the dichroic filter in the second pixel equalized.

Exemplary embodiments of a solid-state imaging device will be explained below in detail with reference to the accompanying drawings. The present invention is not limited to the following embodiments.

First Embodiment

Figure 1:
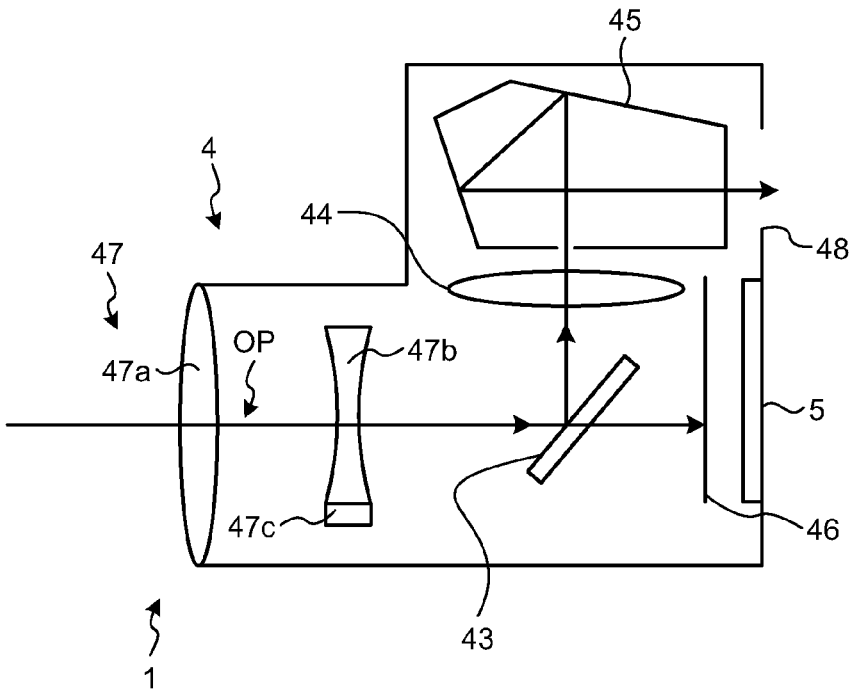
FIG. 1 is a diagram showing the configuration of an imaging system to which the solid-state imaging device according to the first embodiment is applied.
Figure 2:
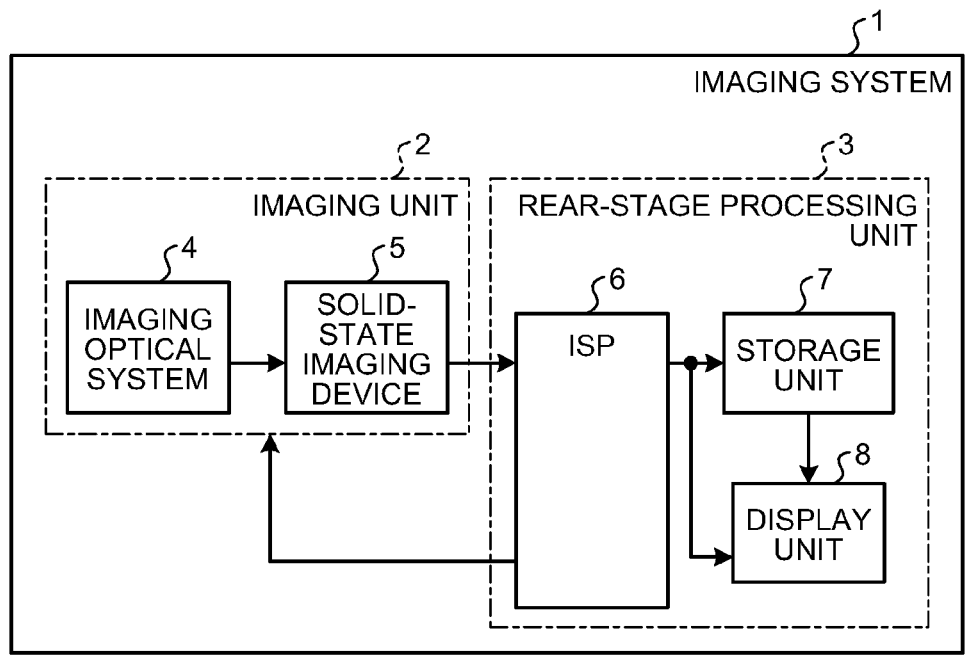
FIG. 2 is a diagram showing the configuration of the imaging system to which the solid-state imaging device according to the first embodiment is applied.

The solid-state imaging device according to the first embodiment will be described. The solid-state imaging device is applied to, for example, an imaging system as shown in FIGS. 1 and 2. FIGS. 1 and 2 are diagrams showing schematically the configuration of the imaging system.

The imaging system 1 may be, for example, a digital camera, a digital video camera, or the like, or a camera module incorporated in an electronic device (e.g., a mobile terminal with a camera). The imaging system 1 has an imaging unit 2 and a rear-stage processing unit 3 as shown in FIG. 2. The imaging unit 2 is, for example, a camera module. The imaging unit 2 has an imaging optical system 4 and the solid-state imaging device 5. The rear-stage processing unit 3 has an ISP (Image Signal Processor) 6, a storage unit 7, and a display unit 8.

The imaging optical system 4 has an imaging lens 47, a half mirror 43, a mechanical shutter 46, a lens 44, a prism 45, and a finder 48. The imaging lens 47 has imaging lenses 47a, 47b, a diaphragm (not shown), and a lens drive mechanism 47c. The diaphragm is placed between the imaging lenses 47a and 47b and adjusts the amount of light guided to the imaging lens 47b. Although FIG. 1 shows illustratively the case where the imaging lens 47 has two imaging lenses 47a, 47b, the imaging lens 47 may have multiple imaging lenses.

The solid-state imaging device 5 is placed at a predicted image plane of the imaging lens 47. For example, the imaging lens 47 refracts incident light to be guided via the half mirror 43 and the mechanical shutter 46 to the image plane of the solid-state imaging device 5 so as to form an image of an object on the image plane (imaging region IR) of the solid-state imaging device 5. The solid-state imaging device 5 generates an image signal according to the object image.

Figure 3:
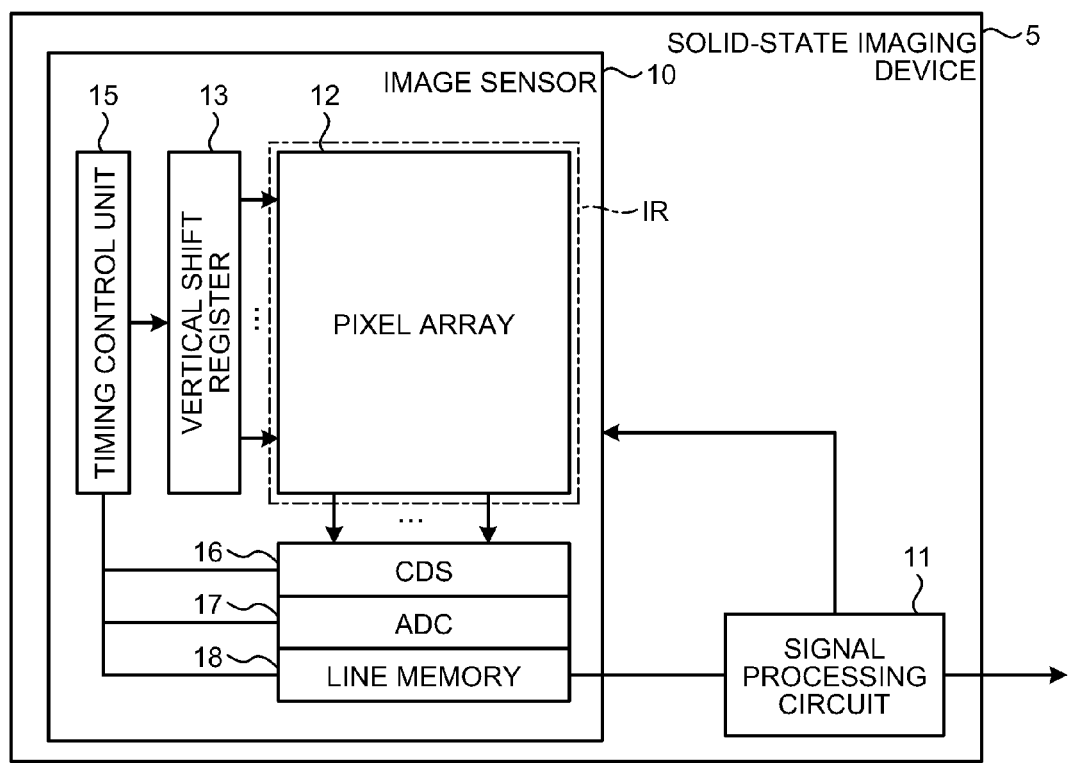
FIG. 3 is a diagram showing the circuit configuration of the solid-state imaging device according to the first embodiment.

The solid-state imaging device 5 has an image sensor 10 and a signal processing circuit 11 as shown in FIG. 3. FIG. 3 is a diagram showing the circuit configuration of the solid-state imaging device. The image sensor 10 may be, for example, a CMOS image sensor or a CCD image sensor. The image sensor 10 has a pixel array 12, a vertical shift register 13, a timing control unit 15, a correlated double sampling unit (CDS) 16, an analog-to-digital converter (ADC) 17, and a line memory 18.

The pixel array 12 is placed at the imaging region IR in the solid-state imaging device 5. The imaging region IR is, for example, in a rectangle shape. The pixel array 12 has a plurality of pixels P arranged two-dimensionally. Each pixel P has a micro-lens ML and a photoelectric conversion portion PD (see FIG. 7). The micro-lens ML concentrates light incident upon the pixel P on the light receiving surface of the photoelectric conversion portion PD. The photoelectric conversion portion PD is, for example, a photodiode and generates a pixel signal according to the amount of received light. That is, the pixel array 12 generates an image signal (analog signal) according to the amounts of light incident upon the pixels P. The generated image signal is read from the pixels P to the CDS 16 side by the timing control unit 15 and the vertical shift register 13 and is converted into an image signal (digital signal) through the CDS 16 and the ADC 17 to be output via the line memory 18 to the signal processing circuit 11. The signal processing circuit 11 performs signal processing on the image signal to generate image data. The generated image data is output to the ISP 6.

The lens drive mechanism 47c shown in FIG. 1 drives the imaging lens 47b along the optical axis OP under the control of the ISP 6 (see FIG. 2). For example, the ISP 6 obtains focus adjustment information according to an AF (Auto Focus) function and controls the lens drive mechanism 47c based on the focus adjustment information to adjust the imaging lenses 47a, 47b to be in focus (just focused).

Next, the incident angle of light (a chief ray) to each pixel P at the imaging region IR will be described using FIG. 4. FIG. 4 is diagram showing the incident angle of light (a chief ray) to each pixel P at the imaging region IR.

In FIG. 4, it is shown that a Z axis is a direction along the optical axis OP, that an X axis is a direction along the transverse side of the imaging region IR, and that a Y axis is a direction along the longitudinal side of the imaging region IR. Note that the Z axis is also a direction along the normal to the surface SBa of a semiconductor substrate SB (see FIG. 7).

Light reflected by an object OB is refracted by the imaging lens 47, and thus an image of the object OB is formed on the imaging region IR (the image plane) of the solid-state imaging device 5. A plurality of pixels P are arranged two-dimensionally on the imaging region IR, and correspondingly a plurality of micro-lenses ML are arranged two-dimensionally (see FIGS. 5A to 5D). At this time, letting the center CP of the imaging region be the intersection point of the optical axis OP and the imaging region IR (the image plane), the light incident angles to the micro-lenses ML of pixels P placed far from the center CP of the imaging region IR are larger as compared with the micro-lenses ML of pixels P placed near the center CP of the imaging region IR.

For example, in FIG. 4, a pixel P-1 is placed near the center CP of the imaging region IR. A pixel P-2 is placed farther from the center CP of the imaging region IR than pixel P-1. Accordingly, compared with the light incident angle $\theta 1$ to the micro-lens ML-1 of pixel P-1, the light incident angle $\theta 2$ to the micro-lens ML-2 of pixel P-2 is larger. A pixel P-3 is placed farther from the center CP of the imaging region IR than pixels P-1, P-2. Accordingly, compared with the light incident angles $\theta 1$, $\theta 2$ to the micro-lenses ML-1, ML-2 of pixels P-1, P-2, the light incident angle $\theta 3$ to the micro-lens ML-3 of pixel P-3 is larger. That is, as to the plurality of pixels P arranged on the imaging region IR, the farther the pixel P is from the center CP of the imaging region IR, the larger the light incident angle to the micro-lens ML of pixel P is.

Here, consider a case where, in order to improve the usage efficiency of light in each pixel P, each pixel P is configured to correspond to two colors and a plurality of such pixels being arranged two-dimensionally on the imaging region IR. In each pixel, a dichroic filter DF is provided between the micro-lens ML and two photoelectric conversion portions PD so that the dichroic filter DF separates light having passed through the micro-lens ML into lights of two different colors to guide the separated light to the two photoelectric conversion portions PD respectively. The dichroic filter DF is provided, for example, between the micro-lens ML and one photoelectric conversion portion PDg of two photoelectric conversion portions PDg, PDb (see FIG. 7). The dichroic filter DF transmits light of a first color (e.g., green) out of light incident on the dichroic filter DF to guide the light of the first color to the photoelectric conversion portion PDg. The dichroic filter DF is provided such that its light incidence surface is inclined and hence reflects light of a second color (e.g., blue or red) out of light incident on the dichroic filter DF to guide the light of the second color to the photoelectric conversion portion PDb. Thus, the micro-lens ML can be made common to the two photoelectric conversion portions PD, and hence the area for the micro-lens ML can be made about twice as large (two pixels worth) as in the basic configuration where one micro-lens ML is provided for each photoelectric conversion portion PD. That is, because each pixel P can photo-electrically convert incident light comparable to two basic-configuration pixels, the usage efficiency of light incident on the micro-lens ML may be improved.

However, if the inclination angle of the light incidence surface of the dichroic filter DF is even for each pixel P regardless of the position of each pixel P in the imaging region IR, then when going farther from the center CP of the imaging region IR, the light incident angle to the micro-lens ML is larger, and hence correspondingly the light incident angle to the dichroic filter DF may be larger. Thus, the light incident angle to the light incidence surface of the dichroic filter DF is likely to be larger, and hence the amount of light in the wavelength range of the first color (e.g., about 550 nm) passing through the dichroic filter DF is likely to attenuate (see FIG. 16A), and a filter property of the dichroic filter DF is likely to degrade. That is, when going farther from the center CP of the imaging region IR, the luminance level (signal level) of the pixel signal generated by the photoelectric conversion portion PD of a pixel P may greatly attenuate. As a result, in the image signal generated in the solid-state imaging device 5, there may occur shading where pixel signals in the periphery of the imaging region IR attenuate in luminance relative to pixel signals in the vicinity of the center CP of the imaging region IR.

Figure 16A:
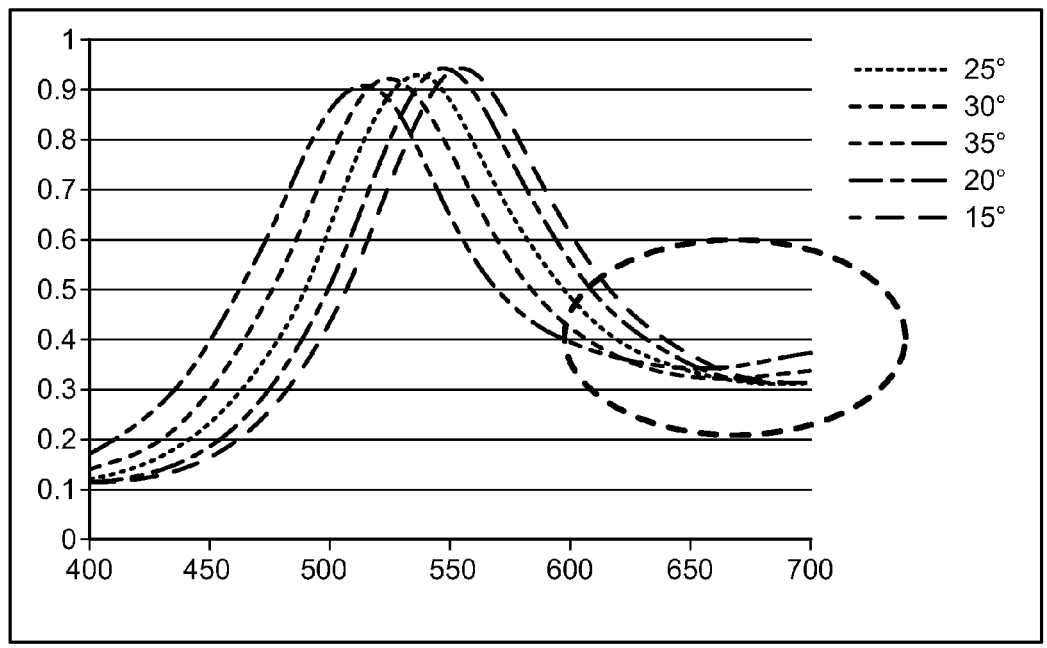
FIGS. 16A and 16B are graphs showing the difference in the reflection characteristic among the dichroic filters in the first embodiment and in a second embodiment.

Further, if the light incident angle to the dichroic filter DF is larger when going farther from the center CP of the imaging region IR, the peak wavelength of light passing through the dichroic filter DF is likely to shift toward the shorter wavelength side (see FIG. 16A). Thus, the color reproducibility of the signal generated in the solid-state imaging device 5 may decrease when going farther from the center CP of the imaging region IR.

Accordingly, in the first embodiment, it is intended to suppress the occurrence of shading and decrease in the color reproducibility by increasing the inclination angle of the light incidence surface of the dichroic filter DF relative to the Z axis direction (a direction along the normal to a surface of the semiconductor substrate) in accordance with a pixel position being farther from the center CP of the imaging region IR.

Specifically, the solid-state imaging device 5 comprises the imaging region IR having a plurality of pixels arranged two-dimensionally as shown in FIGS. 5A to 5D. FIGS. 5A to 5D are diagrams showing the arrangement of a plurality of pixels. The solid-state imaging device 5 is configured to generate, for example, pixel signals of the three primary colors (red, green, blue), and each of the pixels deals corresponds to two colors.

For example, of the plurality of pixels, as shown in FIG. 5A to 5D, pixels Pgb (1, 1) to Pgb (3, 5) and pixels Pgr (1, 2) to Pgr (3, 6), which both form columns along the Y direction, are alternately arranged along the X direction on a column basis. Each of the pixels Pgb (1, 1) to Pgb (3, 5) corresponds to green and blue. Each of the pixels Pgr (1, 2) to Pgr (3, 6) corresponds to green and red.

Each pixel Pgb corresponding to green and blue has the micro-lens ML, an organic color filter film (organic film) CFcy, the dichroic filter DF, a reflective structure RS, a photoelectric conversion portion (first photoelectric conversion portion) PDg, and a photoelectric conversion portion (second photoelectric conversion portion) PDb. Each pixel Pgr corresponding to green and red has the micro-lens ML, an organic color filter film (organic film) CFye, the dichroic filter DF, a reflective structure RS, a photoelectric conversion portion (first photoelectric conversion portion) PDg, and a photoelectric conversion portion (second photoelectric conversion portion) PDr.

Figure 5A:
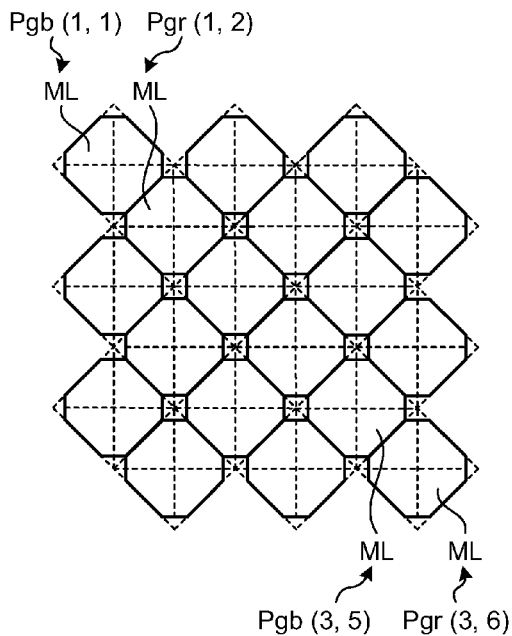
FIGS. 5A to 5D are diagrams showing the arrangements of a plurality of pixels in the first embodiment.

The micro-lens ML of pixels Pgb, Pgr is placed above the photoelectric conversion portions PDg, PDb, PDr and in a position corresponding to, e.g., the photoelectric conversion portion PDg. Further, the micro-lens ML of pixel Pgb, Pgr is placed on the corresponding organic color filter film CFcy, CFye (see FIG. 7). Thus, the micro-lens ML of pixel Pgb, Pgr guides incident light to the corresponding organic color filter film CFcy, CFye. For the plurality of pixels, the arrangement pitches along the Y direction of the micro-lenses ML of pixels Pgb and the arrangement pitches along the Y direction of the micro-lenses ML of pixels Pgr are even as shown in FIG. 5A. The placement positions along the Y direction of the micro-lenses ML of pixels Pgb and the corresponding placement positions along the Y direction of the micro-lenses ML of pixels Pgr are offset along the Y direction by about half of the Y-direction arrangement pitch. The arrangement pitches along the X direction of the micro-lenses ML of pixels Pgb and the arrangement pitches along the X direction of the micro-lenses ML of pixels Pgr are even. The placement positions along the X direction of the micro-lenses ML of pixels Pgb and the corresponding placement positions along the X direction of the micro-lenses ML of pixels Pgr are offset along the X direction by about half of the X-direction arrangement pitch.

Figure 5B:
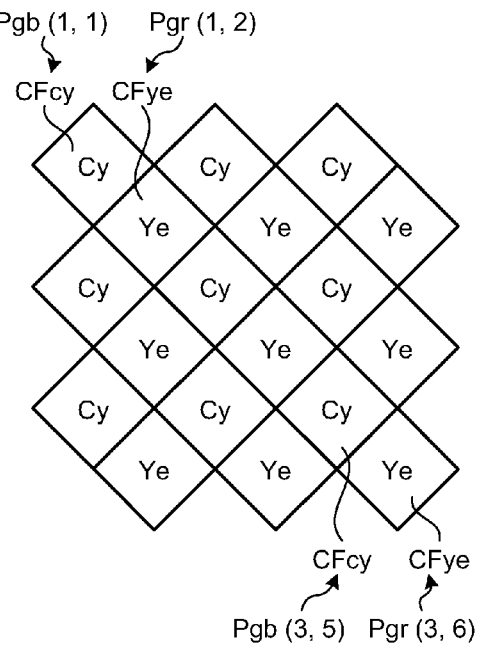
Figure 5C:
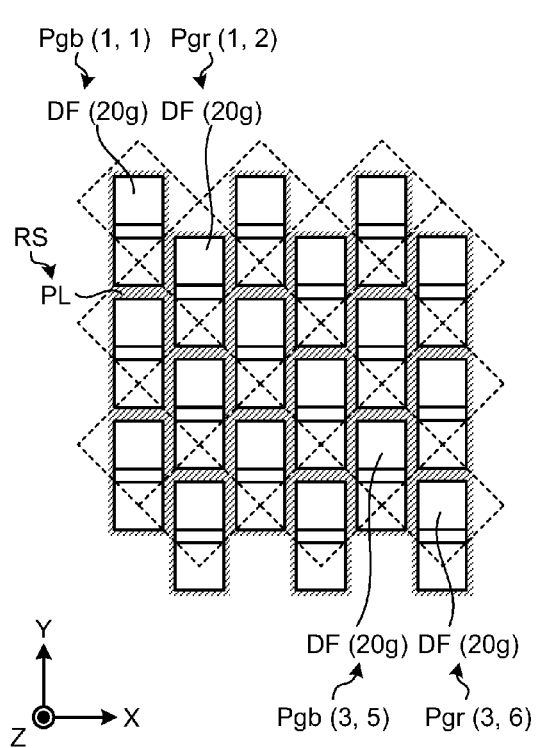
Figure 5D:
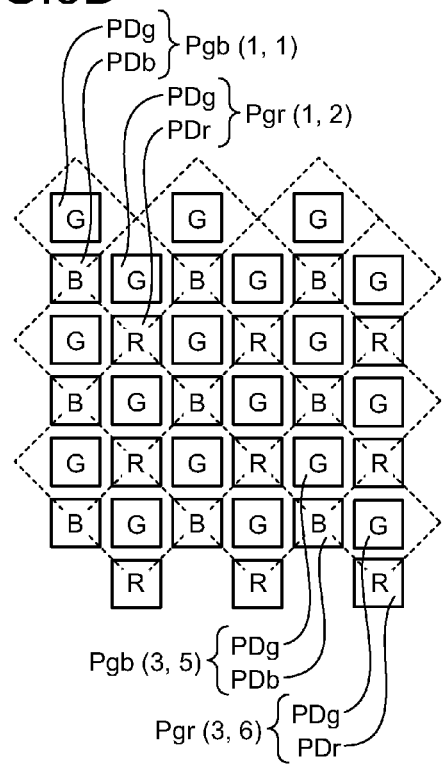

The light receiving area of each micro-lens ML is substantially equal in plan view to that of the organic color filter film CFcy, CFye (see FIG. 5B) and is about twice the light receiving area of the photoelectric conversion portion PDg, PDb, PDr (see FIG. 5D).

The organic color filter film CFcy, CFye is placed between the micro-lens ML and the photoelectric conversion portion PDg, PDb, PDr and in a position corresponding to, e.g., the photoelectric conversion portion PDg. The upper surface of the organic color filter film CFcy, CFye is covered by the micro-lenses ML (see FIG. 7). The organic color filter film CFcy, CFye has a shape corresponding to that of the micro-lens ML in plan view. Thus, the organic color filter film CFcy, CFye selectively transmits light of the first color and light of the second color out of light having passed through the micro-lenses ML. For example, the organic color filter film CFcy of the pixel Pgb includes, for example, a cyan pigment and selectively transmits light of green (the first color) and light of blue (the second color) out of light having passed through the micro-lenses ML. For example, the organic color filter film CFye of the pixel Pgr includes, for example, a yellow pigment and selectively transmits light of green (the first color) and light of red (the second color) out of light having passed through the micro-lenses ML.

Each organic color filter film CFcy, CFye is provided having a size comparable to that of two of the photoelectric conversion portions PDg, PDb, PDr to overlap them as shown in FIG. 5B. The light receiving area of each organic color filter film CFcy, CFye is substantially equal in plan view to that of the micro-lens ML (see FIG. 5A) and is about twice the light receiving area of the photoelectric conversion portion PDg, PDb, PDr (see FIG. 5D).

Figure 7:
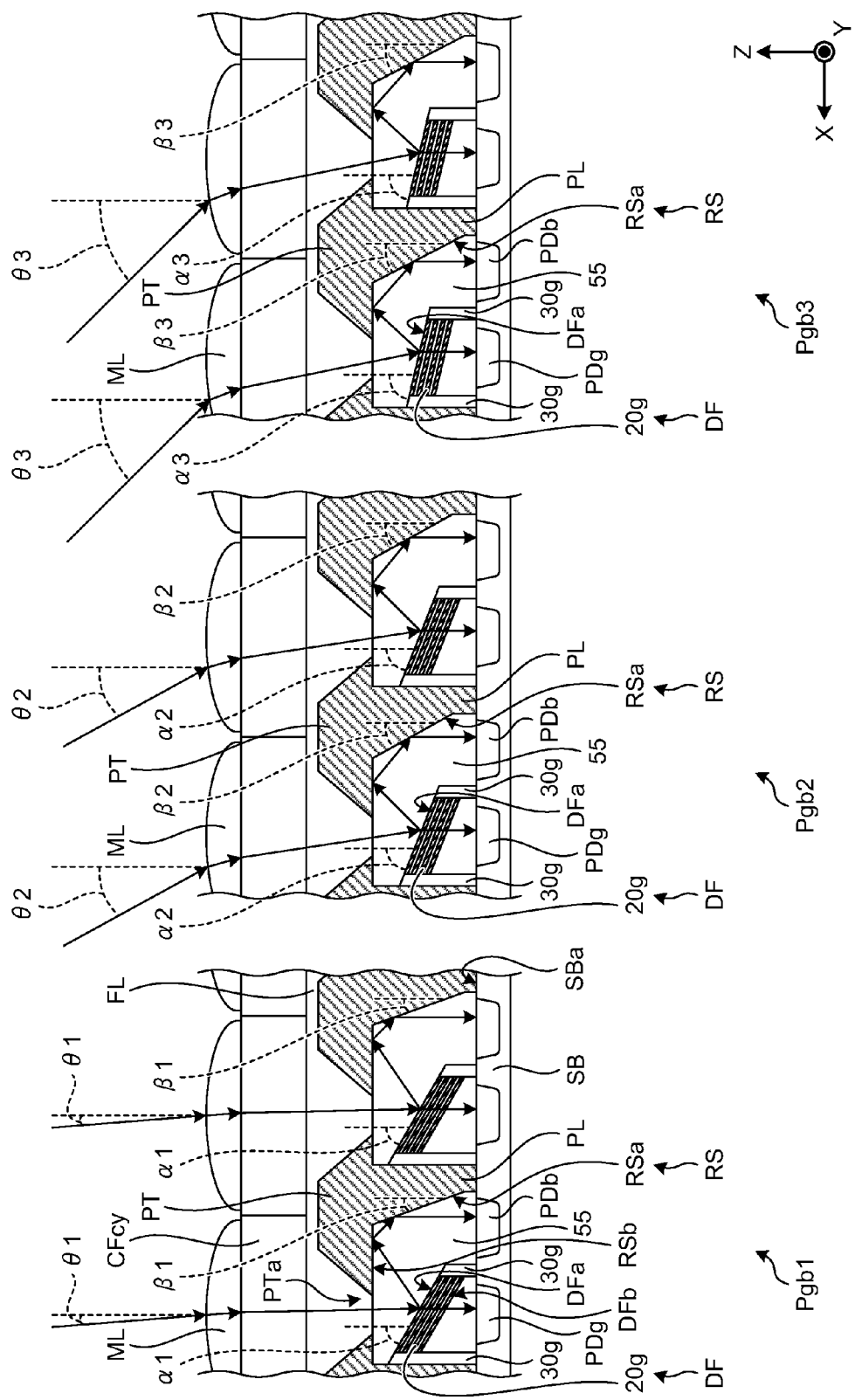
FIG. 7 is a diagram showing the inclination angle of the light incidence surface of a dichroic filter according to the position of a pixel in the first embodiment.

The dichroic filter DF of each pixel Pgb, Pgr is placed between the organic color filter film CFcy, CFye and the photoelectric conversion portion PDg, PDb, PDr and in a position corresponding to, e.g., the photoelectric conversion portion PDg (see FIG. 7). A pattern PT of a metal film placed between the organic color filter film CFcy, CFye and the dichroic filter DF has an opening PTa in a position corresponding to the dichroic filter DF. Thus, light having passed through the organic color filter film CFcy, CFye is guided through the opening PTa to the dichroic filter DF. A flattened film FL covers the pattern PT of the metal film and the openings PTa and provides a flat surface for the organic color filter films CFcy, CFye. The organic color filter films CFcy, CFye cover the surface of the flattened film FL (see FIG. 7).

Further, the dichroic filter DF has a light incidence surface DFa and a light exit surface DFb (see FIG. 7). The light incidence surface DFa is a surface inclined at an angle relative to the normal (Z axis direction) to the surface SBa of the semiconductor substrate SB. The light exit surface DFb is a surface via which to emit light having passed through and which is substantially parallel to the light incidence surface DFa. The light incidence surface DFa of the dichroic filter DF is placed to cover the photoelectric conversion portion PDg when seen through in a Z axis direction and is inclined toward the photoelectric conversion portion PDb, PDr. The inclination angle of the light incidence surface DFa relative to the Z axis direction (a direction along the normal to the surface of the semiconductor substrate) is increased in accordance with a pixel position being farther from the center CP of the imaging region IR.

Thus, the dichroic filter DF transmits light of the first color out of light having passed through the organic color filter film CFcy, CFye to guide the light of the first color to the photoelectric conversion portion PDg and reflects light of the second color to guide the light of the second color to the photoelectric conversion portion PDb, PDr. For example, the dichroic filter DF of each pixel Pgb transmits light of green (the first color) out of light having passed through the organic color filter film CFcy to guide the light of green to the photoelectric conversion portion PDg and reflects light of blue (the second color) to guide the light of blue to the photoelectric conversion portion PDb. For example, the dichroic filter DF of each pixel Pgr transmits light of green (the first color) out of light having passed through the organic color filter film CFye to guide the light of green to the photoelectric conversion portion PDg and reflects light of red (the second color) to guide the light of red to the photoelectric conversion portion PDr. That is, the dichroic filter DF of each pixel Pgb and the dichroic filter DF of each pixel Pgr are both configured to transmit light of green and reflect light other than green.

For example, the dichroic filter DF includes a multi-layer interference filter 20g, in which first layers and second layers different in refractive index are alternately laid one over the other, and an insulating film 30g covering the side surfaces of the multi-layer interference filter 20g. Specifically, in the multi-layer interference filter 20g, the first layers 21g-1, 21g-2, 21g-3, 21g-4 and the second layers 22g-1, 22g-2, 22g-3 are alternately laid one over the other (see FIG. 12B). The refractive index of the first layers 21g-1 to 21g-4 is greater than that of the second layers 22g-1 to 22g-3. The first layers 21g-1 to 21g-4 are formed of, e.g., titanium oxide ($TiO_2$, refractive index: 2.5). The second layers 22g-1 to 22g-3 are formed of, e.g., silicon oxide ($SiO_2$, refractive index: 1.45).

Each first layer 21g-1 to 21g-4 has similar film thickness (e.g., such a film thickness that the optical film thickness is one fourth of the center wavelength (e.g., 550 nm)). Each second layer 22g-1, 22g-3 has similar film thickness (e.g., such a film thickness that the optical film thickness is one fourth of the center wavelength (e.g., 550 nm)). In contrast, the film thickness of the second layer 22g-2 is thinner than that of the other second layers 22g-1, 22g-3. Hereinafter, this second layer 22g-2 is also called a spacer layer 22g-2. For example, if the film thickness of the spacer layer 22g-2 is 35 nm, the multi-layer interference filter 20g has a peak of spectral transmittance in the wavelength range of green (G).

The insulating film 30g (see FIG. 7) covers the side surfaces of the multi-layer interference filter 20g. The insulating film 30g may be formed of a material (e.g., silicon nitride) different in refractive index from any of the first layers 21g-1 to 21g-4 and the second layers 22g-1 to 22g-3. This can make the interface between the multi-layer interference filter 20g and the insulating film 30g function as a reflective surface, which prevents the leakage of light multiple-reflected in the multi-layer interference filter 20g to the photoelectric conversion portion PDb, PDr side. Thus, light multiple-reflected in the multi-layer interference filter 20g can be efficiently guided to the photoelectric conversion portion PDg side.

The reflective structure RS of each pixel Pgb, Pgr receiving light of the second color reflected by the dichroic filter DF further reflects the light of the second color to guide the light of the second color to the photoelectric conversion portion PDb, PDr. The reflective structure RS has, for example, a reflective surface RSb and an inclined reflective surface RSa. The reflective surface RSb is formed at the interface between the pattern PT of the metal film and an insulating film pattern 55 (see FIG. 7). The inclined reflective surface RSa is formed at the interface between a plug PL extending in a Z direction from the lower end of the pattern PT of the metal film to the semiconductor substrate SB and the insulating film pattern 55 (see FIG. 7). The inclined reflective surface RSa inclines relative to the normal to the surface SBa of the semiconductor substrate SB correspondingly to the light incidence surface DFa of the dichroic filter DF.

For example, light of the second color reflected by the light incidence surface DFa of the dichroic filter DF is reflected by the reflective surface RSb and incident on the inclined reflective surface RSa, and the incident light is reflected by the inclined reflective surface RSa to be guided to the photoelectric conversion portion PDb, PDr.

The photoelectric conversion portion PDg of each pixel Pgb, Pgr receives light of the first color (e.g., green) having passed through the dichroic filter DF and generates and stores electric charges according to the amount of the light. The photoelectric conversion portion PDg is, for example, a photodiode.

The photoelectric conversion portion PDb of each pixel Pgb receives light of the second color (e.g., blue) reflected by the dichroic filter DF and further reflected by the reflective structure RS and generates and stores electric charges according to the amount of the light. The photoelectric conversion portion PDb is, for example, a photodiode.

The photoelectric conversion portion PDr of each pixel Pgr receives light of the second color (e.g., red) reflected by the dichroic filter DF and further reflected by the reflective structure RS and generates and stores electric charges according to the amount of the light. The photoelectric conversion portion PDr is, for example, a photodiode.

The reflective structure RS has the inclined reflective surface RSa formed at the interface between the plug PL surrounding the photoelectric conversion portion PDb, PDr as indicated by oblique line hatching in FIG. 5C, when seen through in a Z direction, and the insulating film pattern 55 (see FIG. 7). With this configuration, light of the second color can be guided to the photoelectric conversion portion PDb, PDr.

Figure 6:
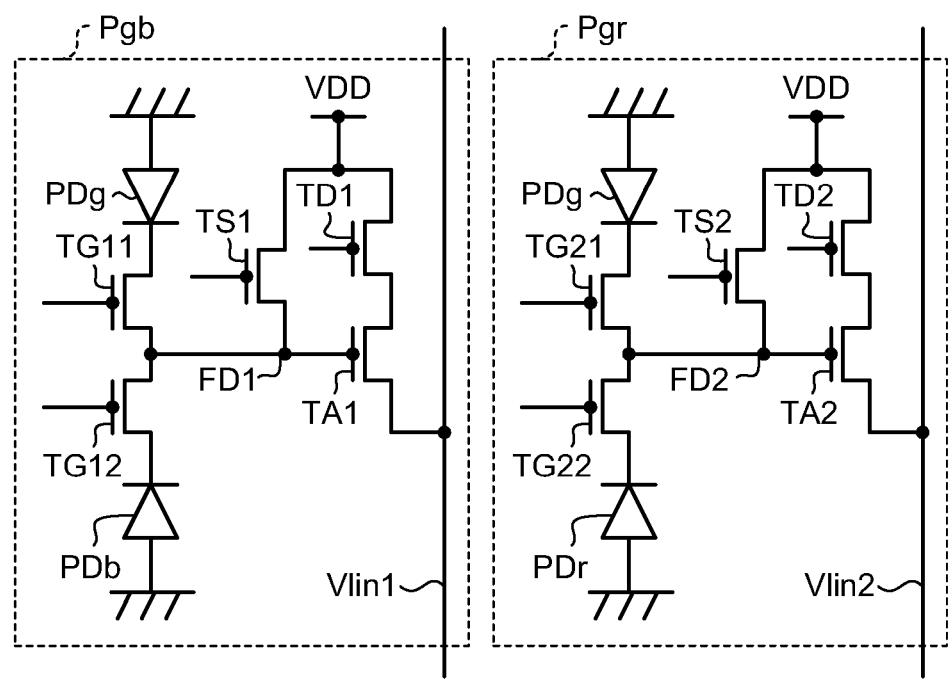
FIG. 6 is a diagram showing the circuit configuration of a pixel in the first embodiment.

Next, the circuit configuration of each pixel will be described using FIG. 6. FIG. 6 is a diagram showing the circuit configuration of each pixel.

Each pixel Pgb has the photoelectric conversion portions PDg, PDb, transfer portions TG11, TG12, a charge voltage conversion portion FD1, a reset portion TS1, a selection portion TD1, and an amplification portion TA1.

The photoelectric conversion portion PDg generates and stores electric charges according to the amount of light of, e.g., the first color (e.g., green). The photoelectric conversion portion PDg is, for example, a photodiode.

The photoelectric conversion portion PDb generates and stores electric charges according to the amount of light of, e.g., the second color (e.g., blue). The photoelectric conversion portion PDb is, for example, a photodiode.

When in an active state, the transfer portion TG11 transfers electric charges generated in the photoelectric conversion portion PDg to the charge voltage conversion portion FD1 and when in a non-active state, electrically disconnects between the photoelectric conversion portion PDg and the charge voltage conversion portion FD1. The transfer portion TG11 is, for example, a transfer transistor and when a control signal of an active level is supplied to the gate, turns on to transfer electric charges of the photoelectric conversion portion PDg to the charge voltage conversion portion FD1 and when the control signal of a non-active level is supplied to the gate, turns off to electrically disconnect between the photoelectric conversion portion PDg and the charge voltage conversion portion FD1.

When in an active state, the transfer portion TG12 transfers electric charges generated in the photoelectric conversion portion PDb to the charge voltage conversion portion FD1 and when in a non-active state, electrically disconnects between the photoelectric conversion portion PDb and the charge voltage conversion portion FD1. The transfer portion TG12 is, for example, a transfer transistor and when a control signal of an active level is supplied to the gate, turns on to transfer electric charges of the photoelectric conversion portion PDb to the charge voltage conversion portion FD1 and when the control signal of a non-active level is supplied to the gate, turns off to electrically disconnect between the photoelectric conversion portion PDb and the charge voltage conversion portion FD1.

The charge voltage conversion portion FD1 converts the transferred electric charge to a voltage. The charge voltage conversion portion FD1 is, for example, a floating diffusion.

The reset portion TS1 resets the voltage on the charge voltage conversion portion FD1. The reset portion TS1 is, for example, a reset transistor and when a control signal of an active level is supplied to the gate, turns on to reset the voltage on the charge voltage conversion portion FD1 and when the control signal of a non-active level is supplied to the gate, turns off not to reset the voltage on the charge voltage conversion portion FD1.

The selection portion TD1 puts the pixel Pgb in a selected state or non-selected state. The selection portion TD1 is, for example, a select transistor and when a control signal of an active level is supplied to the gate, turns on to put the pixel Pgb in the selected state and when the control signal of a non-active level is supplied to the gate, turns off to put the pixel Pgb in the non-selected state.

When the pixel Pgb is in the selected state, the amplification portion TA1 outputs a signal corresponding to the voltage of the charge voltage conversion portion FD1 onto a signal line Vlin1. The amplification portion TA1 is, for example, an amplification transistor and when the pixel Pgb is in the selected state, performs source follower operation with a load current source (not shown) connected to the signal line Vlin1 to output a signal corresponding to the voltage on the charge voltage conversion portion FD1 onto the signal line Vlin1.

In the pixel Pgb, by putting the transfer portion TG11 in the active state with keeping the transfer portion TG12 in the non-active state, the electric charge of the photoelectric conversion portion PDg is converted to a voltage by the charge voltage conversion portion FD1, so that a pixel signal for light of the first color (e.g., green) can be output via the amplification portion TA1 onto the signal line Vlin1. Then, after the reset portion TS1 resets the voltage of the charge voltage conversion portion FD1, by putting the transfer portion TG12 in the active state with keeping the transfer portion TG11 in the non-active state, the electric charge of the photoelectric conversion portion PDb is converted to a voltage by the charge voltage conversion portion FD1, so that a pixel signal for light of the second color (e.g., blue) can be output via the amplification portion TA1 onto the signal line Vlin1.

Each pixel Pgr has the photoelectric conversion portions PDg, PDr, transfer portions TG21, TG22, a charge voltage conversion portion FD2, a reset portion TS2, a selection portion TD2, and an amplification portion TA2. In the pixel Pgr, by putting the transfer portion TG21 in the active state with keeping the transfer portion TG22 in the non-active state, the electric charge of the photoelectric conversion portion PDg is converted to a voltage by the charge voltage conversion portion FD2, so that a pixel signal for light of the first color (e.g., green) can be output via the amplification portion TA2 onto a signal line Vlin2. Then, after the reset portion TS2 resets the voltage of the charge voltage conversion portion FD2, by putting the transfer portion TG22 in the active state with keeping the transfer portion TG21 in the non-active state, the electric charge of the photoelectric conversion portion PDr is converted to a voltage by the charge voltage conversion portion FD2, so that a pixel signal for light of the second color (e.g., red) can be output via the amplification portion TA2 onto the signal line Vlin2.

That is, from the pixels Pgb and Pgr, the pixel signal of one photoelectric conversion portion PDb for blue, the pixel signal of one photoelectric conversion portion PDr for red, and the pixel signals of two photoelectric conversion portions PDg for green can be read out, so that pixel signals of four colors (R, Gr, B, Gb), which form a unit in a Bayer array, can be read out.

Next, characteristics of the configuration of the dichroic filter according to the position of the pixel will be described using FIGS. 7 and 8. FIG. 7 is a diagram showing the inclination angle of the light incidence surface of the dichroic filter according to the position of the pixel. FIG. 8 is a diagram showing the positions of pixels Pgb in the imaging region IR. In FIG. 8, pixels Pgr are not shown for simplicity of the illustration.

Specifically, as shown in FIG. 8, the inside of the imaging region IR is divided into a region around the center CP of the imaging region IR and its surrounding region. For example, the inside of the imaging region IR is divided into a center region CA including the center CP of the imaging region IR, shown as the region inside the broken line in FIG. 8, and a periphery region PA, shown as the region outside the broken line in FIG. 8.

Then, as shown in FIG. 7, from among the plurality of pixels, the inclination angle relative to the Z axis direction of the light incidence surface DFa of the dichroic filter DF in the pixels of the periphery region PA is made greater than the inclination angle relative to the Z axis direction of the light incidence surface DFa of the dichroic filter DF in the pixels of the center region CA.

For example, the dichroic filters DF (the multi-layer interference filter 20g) in pixels Pgb1, Pgb2 shown in FIG. 7 are both placed to selectively guide light of green (G) to the photoelectric conversion portion PDg. The pixel Pgb1 is included in the center region CA, and the pixel Pgb2 is included in the periphery region PA (see FIG. 8). That is, the pixel Pgb2 is placed in a position farther from the center CP of the imaging region IR than the pixel Pgb1. In the pixel Pgb1 of the center region CA, the dichroic filter DF has a light incidence surface DFa inclined at an inclination angle $\alpha 1$ relative to the Z axis direction correspondingly to the light incident angle $\theta 1$ to the micro-lens ML. In the pixel Pgb2 of the periphery region PA, the dichroic filter DF has a light incidence surface DFa inclined at an inclination angle $\alpha 2$ ($>\alpha 1$) relative to the Z axis direction correspondingly to the light incident angle $\theta 2$ ($>\theta 1$) to the micro-lens ML. That is, the inclination angle $\alpha 2$ of the light incidence surface DFa of the dichroic filter DF in the pixel Pgb2 of the periphery region PA is greater than the inclination angle α1 of the light incidence surface DFa of the dichroic filter DF in the pixel Pgb1 of the center region CA.

Thus, the light incident angle to the light incidence surface DFa of the dichroic filter DF in the pixel Pgb2 of the periphery region PA can be made close to the light incident angle to the light incidence surface DFa of the dichroic filter DF in the pixel Pgb1 of the center region CA, so that the filter property of the dichroic filter DF (the multi-layer interference filter 20g) in the pixel Pgb2 of the periphery region PA and the filter property of the dichroic filter DF (the multi-layer interference filter 20g) in the pixel Pgb1 of the center region CA can be made equalized. As a result, the amount of received light of the photoelectric conversion portion PDg in the pixel Pgb2 of the periphery region PA can be made close to the amount of received light of the photoelectric conversion portion PDg in the pixel Pgb1 of the center region CA.

Accordingly, as shown in FIG. 7, from among the plurality of pixels, the inclination angle relative to the Z axis direction of the inclined reflective surface RSa of the reflective structure RS in the pixels of the periphery region PA is made greater than the inclination angle relative to the Z axis direction of the inclined reflective surface RSa of the reflective structure RS in the pixels of the center region CA.

For example, the reflective structures RS in pixels Pgb1, Pgb2 shown in FIG. 7 are both configured to guide light of blue (B) to the photoelectric conversion portion PDb. The reflective structure RS in the pixel Pgb1 of the center region CA has an inclined reflective surface RSa inclined at an inclination angle β1 relative to the Z axis direction. The reflective structure RS in the pixel Pgb2 of the periphery region PA has an inclined reflective surface RSa inclined at an inclination angle β2 (>β1) relative to the Z axis direction. That is, the inclination angle θ2 of the inclined reflective surface RSa of the reflective structure RS in the pixel Pgb2 of the periphery region PA is greater than the inclination angle β1 of the inclined reflective surface RSa of the reflective structure RS in the pixel Pgb1 of the center region CA.

Thus, the light incident angle to the inclined reflective surface RSa of the reflective structure RS in the pixel Pgb2 of the periphery region PA can be made close to the light incident angle to the inclined reflective surface RSa of the reflective structure RS in the pixel Pgb1 of the center region CA. As a result, the amount of received light of the photoelectric conversion portion PDb in the pixel Pgb2 of the periphery region PA can be made close to the amount of received light of the photoelectric conversion portion PDb in the pixel Pgb1 of the center region CA.

It should be noted that, although in the above the case has been described where the two levels of the inclination angle of the light incidence surface DFa of the dichroic filter DF in the pixel Pgb1 of the center region CA and the inclination angle of the light incidence surface DFa of the dichroic filter DF in the pixel of the periphery region PA are set, multiple levels may be set so as to increase the inclination angle in a multi-stepwise fashion. For example, as shown in FIG. 8, the inside of the imaging region IR is divided into the region around the center CP of the imaging region IR, its periphery region, and a region at the periphery of the periphery region. For example, the inside of the imaging region IR is divided into the center region CA including the center CP of the imaging region IR, shown as the region inside the broken line in FIG. 8, a periphery region PA1, shown as the region between the broken line and the dot-dashed line in FIG. 8, and a periphery region PA2, shown as the region between the dot-dashed line and the two-dot-dashed line in FIG. 8. That is, the periphery region PA1 is outside the center region CA, and the periphery region PA2 is outside the periphery region PA1.

Then, as shown in FIG. 7, from among the plurality of pixels Pgb1, Pgb2, Pgb3, the inclination angle of the light incidence surface DFa of the dichroic filter DF in the pixel Pgb2 of the periphery region PA1 is made greater than that of the dichroic filter DF in the pixel Pgb1 of the center region CA. Also, the inclination angle of the light incidence surface DFa of the dichroic filter DF in the pixel Pgb3 of the periphery region PA2 is made greater than that of the dichroic filter DF in the pixel Pgb2 of the periphery region PA1.

For example, the dichroic filters DF (the multi-layer interference filter 20g) in pixels Pgb1, Pgb2, Pgb3 shown in FIG. 7 are all placed to selectively guide light of green (G) to the photoelectric conversion portion PDg. The pixel Pgb1 is included in the center region CA; the pixel Pgb2 is included in the periphery region PA1; and the pixel Pgb3 is included in the periphery region PA2 (see FIG. 8). That is, the pixel Pgb2 is placed in a position farther from the center CP of the imaging region IR than the pixel Pgb1. The pixel Pgb3 is placed in a position farther from the center CP of the imaging region IR than the pixel Pgb2. In the pixel Pgb1 of the center region CA, the dichroic filter DF has a light incidence surface DFa inclined at an inclination angle α1 relative to the Z axis direction correspondingly to the light incident angle θ1 to the micro-lens ML. In the pixel Pgb2 of the periphery region PA1, the dichroic filter DF has a light incidence surface DFa inclined at an inclination angle α2 (>α1) relative to the Z axis direction correspondingly to the light incident angle θ2 (>θ1) to the micro-lens ML. In the pixel Pgb3 of the periphery region PA2, the dichroic filter DF has a light incidence surface DFa inclined at an inclination angle α3 (>α2) relative to the Z axis direction correspondingly to the light incident angle θ3 (>θ2) to the micro-lens ML. That is, the inclination angle α1 of the light incidence surface DFa of the dichroic filter DF in the pixel Pgb1 of the center region CA, the inclination angle α2 of the light incidence surface DFa of the dichroic filter DF in the pixel Pgb2 of the periphery region PA1, and the inclination angle α3 of the light incidence surface DFa of the dichroic filter DF in the pixel Pgb3 of the periphery region PA2 can be made greater than one another in a multi-stepwise fashion.

Thus, the light incident angle to the light incidence surface DFa of the dichroic filter DF in the pixel Pgb2 of the periphery region PA1 can be made close to the light incident angle to the light incidence surface DFa of the dichroic filter DF in the pixel Pgb1 of the center region CA. The light incident angle to the light incidence surface DFa of the dichroic filter DF in the pixel Pgb3 of the periphery region PA2 can be made close to the light incident angle to the light incidence surface DFa of the dichroic filter DF in the pixel Pgb1 of the center region CA.

At this time, for the incident light guided to the imaging region IR to form an object image (see FIG. 4), the filter property of the dichroic filter DF (the multi-layer interference filter 20g) in the pixel Pgb2 of the periphery region PA1 and the filter property of the dichroic filter DF (the multi-layer interference filter 20g) in the pixel Pgb1 of the center region CA can be equalized. The filter property of the dichroic filter DF (the multi-layer interference filter 20g) in the pixel Pgb3 of the periphery region PA2 and the filter property of the dichroic filter DF (the multi-layer interference filter 20g) in the pixel Pgb2 of the periphery region PA1 can be equalized. That is, the filter property of the dichroic filter DF (the multi-layer interference filter 20g) in the pixel Pgb3 of the periphery region PA2, the filter property of the dichroic filter DF (the multi-layer interference filter 20g) in the pixel Pgb2 of the periphery region PA1, and the filter property of the dichroic filter DF (the multi-layer interference filter 20g) in the pixel Pgb1 of the center region CA can be made equalized. As a result, the amount of received light of the photoelectric conversion portion PDg in the pixel Pgb3 of the periphery region PA2 can be made close to the amount of received light of the photoelectric conversion portion PDg in the pixel Pgb1 of the center region CA, and the amount of received light of the photoelectric conversion portion PDg in the pixel Pgb2 of the periphery region PA1 can be made close to the amount of received light of the photoelectric conversion portion PDg in the pixel Pgb1 of the center region CA.

Accordingly, as shown in FIG. 7, from among the plurality of pixels Pgb1, Pgb2, Pgb3, the inclination angle relative to the Z axis direction of the inclined reflective surface RSa of the reflective structure RS in the pixel Pgb1 of the center region CA, that of the reflective structure RS in the pixel Pgb2 of the periphery region PA1, and that of the reflective structure RS in the pixel Pgb3 of the periphery region PA2 can be made greater than one another in a multi-stepwise fashion.

For example, the reflective structures RS in pixels Pgb1, Pgb2, Pgb3 shown in FIG. 7 are all configured to guide light of blue (B) to the photoelectric conversion portion PDb. The reflective structure RS in the pixel Pgb1 of the center region CA has an inclined reflective surface RSa inclined at an inclination angle β1 relative to the Z axis direction correspondingly to the inclination angle α1 of the light incidence surface DFa of the dichroic filter DF. The reflective structure RS in the pixel Pgb2 of the periphery region PA1 has an inclined reflective surface RSa inclined at an inclination angle β2 (>β1) relative to the Z axis direction correspondingly to the inclination angle α2 (>α1) of the light incidence surface DFa of the dichroic filter DF. The reflective structure RS in the pixel Pgb3 of the periphery region PA2 has an inclined reflective surface RSa inclined at an inclination angle β3 (>β2) relative to the Z axis direction correspondingly to the inclination angle α3 (>α2) of the light incidence surface DFa of the dichroic filter DF. That is, the inclination angle β1 of the inclined reflective surface RSa of the reflective structure RS in the pixel Pgb1 of the center region CA, the inclination angle β2 of the inclined reflective surface RSa of the reflective structure RS in the pixel Pgb2 of the periphery region PA1, and the inclination angle β3 of the inclined reflective surface RSa of the reflective structure RS in the pixel Pgb3 of the periphery region PA2 can be made greater than one another in a multi-stepwise fashion.

Thus, the light incident angle to the inclined reflective surface RSa of the reflective structure RS in the pixel Pgb2 of the periphery region PA1 can be made close to the light incident angle to the inclined reflective surface RSa of the reflective structure RS in the pixel Pgb1 of the center region CA. The light incident angle to the inclined reflective surface RSa of the reflective structure RS in the pixel Pgb3 of the periphery region PA2 can be made close to the light incident angle to the inclined reflective surface RSa of the reflective structure RS in the pixel Pgb2 of the periphery region PA1. As a result, the amount of received light of the photoelectric conversion portion PDb in the pixel Pgb3 of the periphery region PA2 can be made close to the amount of received light of the photoelectric conversion portion PDb in the pixel Pgb1 of the center region CA, and the amount of received light of the photoelectric conversion portion PDb in the pixel Pgb2 of the periphery region PA1 can be made close to the amount of received light of the photoelectric conversion portion PDb in the pixel Pgb1 of the center region CA.

Next, a manufacturing method of the solid-state imaging device 5 will be described using FIGS. 9A to 14B and FIG. 7.

FIGS. 9A to 14A are process step cross-sectional views showing the manufacturing method of the solid-state imaging device 5. FIG. 7 is a cross-sectional view showing the configuration of the solid-state imaging device 5, but is also used as a process step cross-sectional view showing the manufacturing method.

Figure 9A:
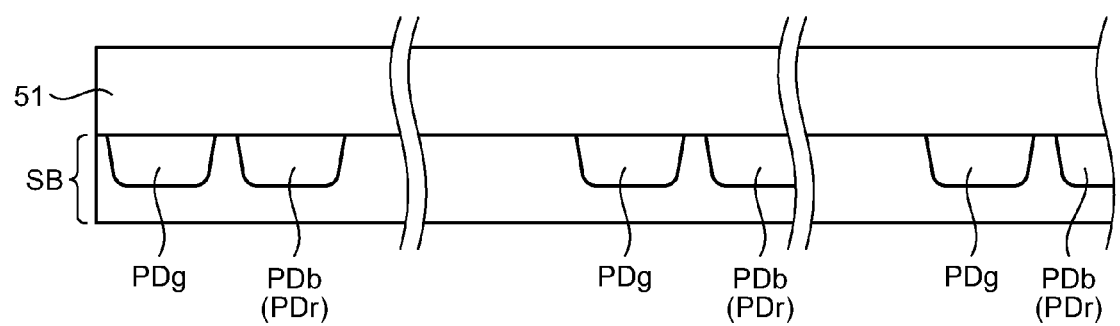
FIGS. 9A and 9B are diagrams showing a manufacturing method of the solid-state imaging device according to the first embodiment.

In the step shown in FIG. 9A, for example, a silicon substrate including an impurity of a first conductivity type (e.g., P type) is prepared as the semiconductor substrate SB. Groups of photoelectric conversion portions including the photoelectric conversion portions PDg and PDb and groups of photoelectric conversion portions including the photoelectric conversion portions PDg and PDr are formed in the semiconductor substrate SB. For example, the photoelectric conversion portions PDg, PDb, PDr are formed as semiconductor regions including an impurity of a second conductivity type (e.g., N type). Then, an interlayer insulating film 51 to be a base for the dichroic filters DF is deposited on the semiconductor substrate SB, that is, over a plurality of photoelectric conversion portion groups. The material for the interlayer insulating film 51 is, for example, $SiO_2$.

Figure 9B:
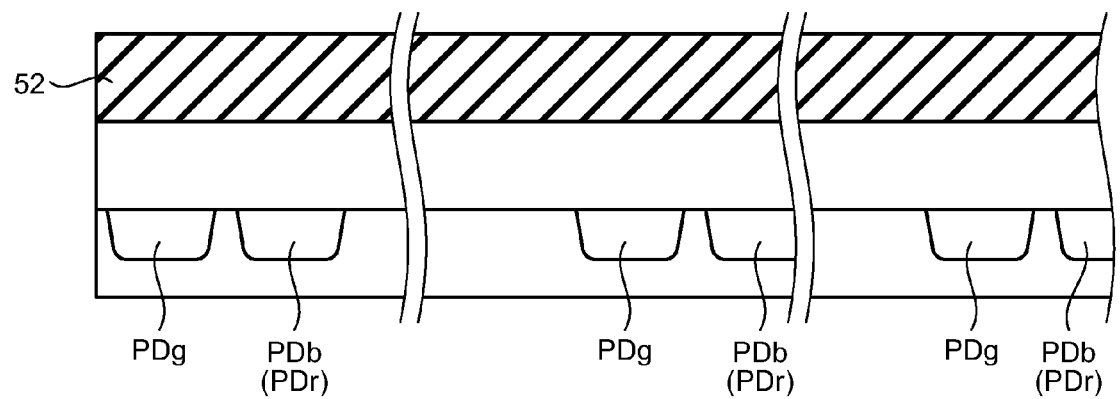

In the step shown in FIG. 9B, a resist 52 for lithography used for the formation of a pattern of dichroic filters DF is coated on the interlayer insulating film 51.

Figure 10A:
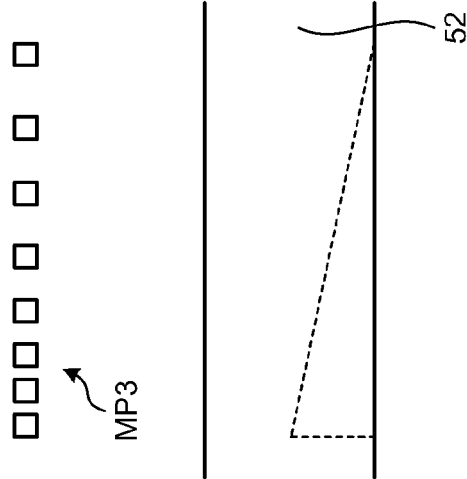
FIGS. 10A to 10C are diagrams showing the manufacturing method of the solid-state imaging device according to the first embodiment.
Figure 10B:
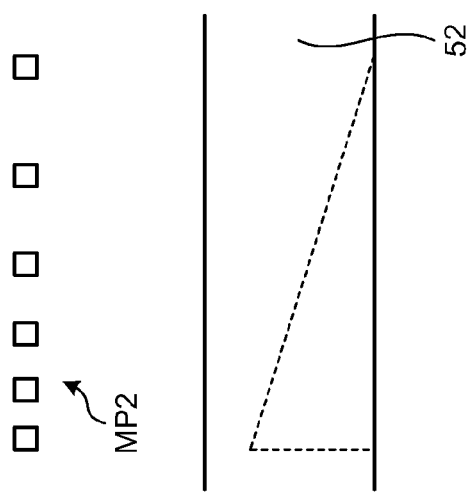
Figure 10C:
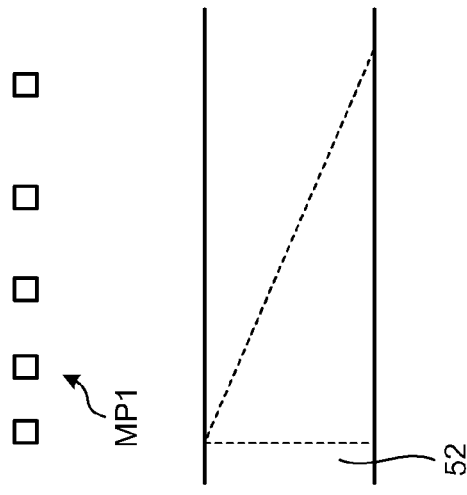

In the step shown in FIGS. 10A to 10C, latent images in an inclined shape corresponding to the dichroic filter DF are formed in the resist 52 using a grating dot mask. The grating dot mask has a mask pattern adjusted such that the exposure amount distribution is in an inclined shape.

For example, in the position in the resist 52 where the dichroic filter DF of the pixel Pgb1 of the center region CA (see FIG. 8) is to be formed, a latent image in an inclined shape corresponding to the inclination angle α1 (see FIG. 7) is formed using a mask pattern MP1 shown in FIG. 10A. In the mask pattern MP1, dots of a pattern corresponding to the inclined shape are placed at gradually-increasing intervals.

For example, in the position in the resist 52 where the dichroic filter DF of the pixel Pgb2 of the periphery region PA or PA1 (see FIG. 8) is to be formed, a latent image in an inclined shape corresponding to the inclination angle α2 (see FIG. 7) is formed using a mask pattern MP2 shown in FIG. 10B. In the mask pattern MP2, dots of a pattern corresponding to the inclined shape are placed at gradually-increasing intervals. The intervals of the dots in the mask pattern MP2 are smaller than the intervals of the corresponding dots in the mask pattern MP1. Thus, the inclination angle of a latent image in an inclined shape formed with the mask pattern MP2 can be made greater than the inclination angle of a latent image in an inclined shape formed with the mask pattern MP1.

For example, in the position in the resist 52 where the dichroic filter DF of the pixel Pgb3 of the periphery region PA2 (see FIG. 8) is to be formed, a latent image in an inclined shape corresponding to the inclination angle α3 (see FIG. 7) is formed using a mask pattern MP3 shown in FIG. 10C. In the mask pattern MP3, dots of a pattern corresponding to the inclined shape are placed at gradually-increasing intervals. The intervals of the dots in the mask pattern MP3 are smaller than the intervals of the corresponding dots in the mask pattern MP2. Thus, the inclination angle of a latent image in an inclined shape formed with the mask pattern MP3 can be made greater than the inclination angle of a latent image in an inclined shape formed with the mask pattern MP2.

Figure 11A:
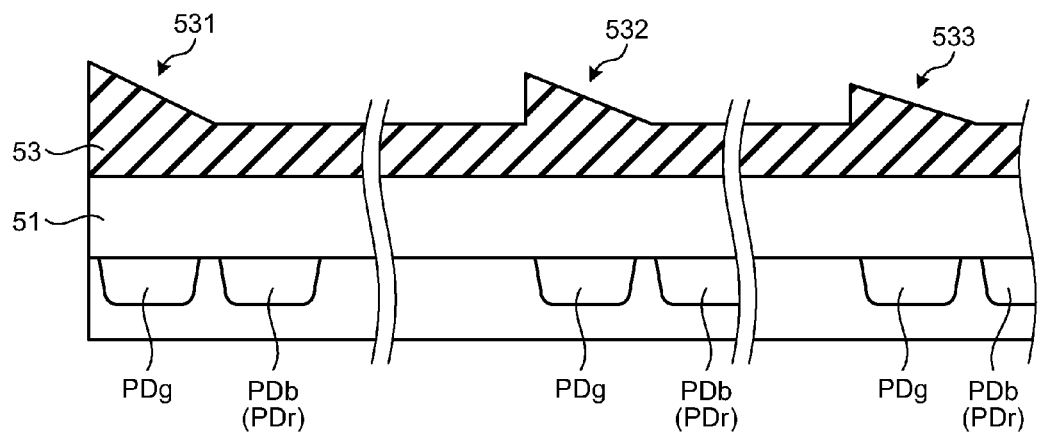
FIGS. 11A and 11B are diagrams showing the manufacturing method of the solid-state imaging device according to the first embodiment.

In the step shown in FIG. 11A, the latent images formed in the resist 52 are developed to form a resist pattern 53. The resist pattern 53 has inclined surface patterns 531 to 533 over the photoelectric conversion portions PDg, that is, in positions where dichroic filters DF are to be formed.

For example, the inclined surface pattern 531 inclined at an angle corresponding to the inclination angle α1 (see FIG. 7) is formed in the position where the dichroic filter DF of the pixel Pgb1 of the center region CA (see FIG. 8) is to be formed.

For example, the inclined surface pattern 532 inclined at an angle corresponding to the inclination angle α2 (see FIG. 7) is formed in the position where the dichroic filter DF of the pixel Pgb2 of the periphery region PA or PA1 (see FIG. 8) is to be formed.

For example, the inclined surface pattern 533 inclined at an angle corresponding to the inclination angle α3 (see FIG. 7) is formed in the position where the dichroic filter DF of the pixel Pgb3 of the periphery region PA2 (see FIG. 8) is to be formed.

Figure 11B:
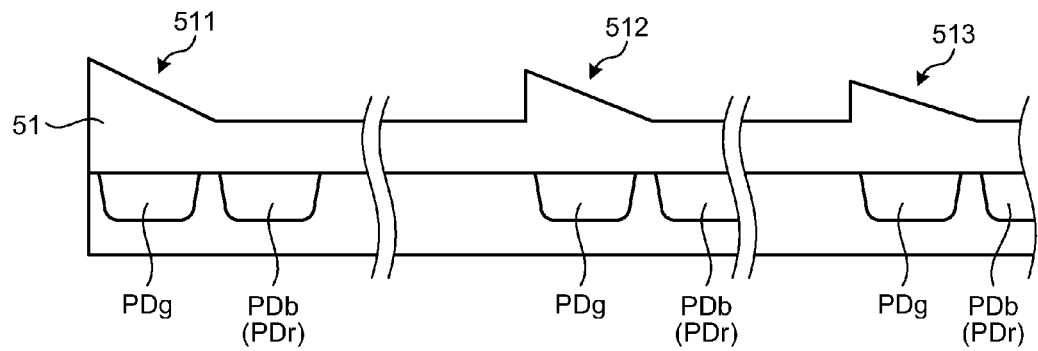

In the step shown in FIG. 11B, anisotropic etching is performed by an RIE method, thereby transferring the resist pattern 53 into the interlayer insulating film 51. That is, by patterning the interlayer insulating film 51, multiple inclined surface patterns 511 to 513 are formed in positions corresponding to multiple dichroic filters DF.

For example, the inclined surface pattern 511 inclined at an angle substantially equal to the inclination angle α1 (see FIG. 7) is formed in the position where the dichroic filter DF of the pixel Pgb1 of the center region CA (see FIG. 8) is to be formed.

For example, the inclined surface pattern 512 inclined at an angle substantially equal to the inclination angle α2 (see FIG. 7) is formed in the position where the dichroic filter DF of the pixel Pgb2 of the periphery region PA or PA1 (see FIG. 8) is to be formed.

For example, the inclined surface pattern 513 inclined at an angle substantially equal to the inclination angle α3 (see FIG. 7) is formed in the position where the dichroic filter DF of the pixel Pgb3 of the periphery region PA2 (see FIG. 8) is to be formed.

That is, in the steps shown in FIG. 9A to FIG. 11B, the inclined surface patterns 511 to 513 to be bases for the multiple dichroic filters DF are formed.

Figure 12A:
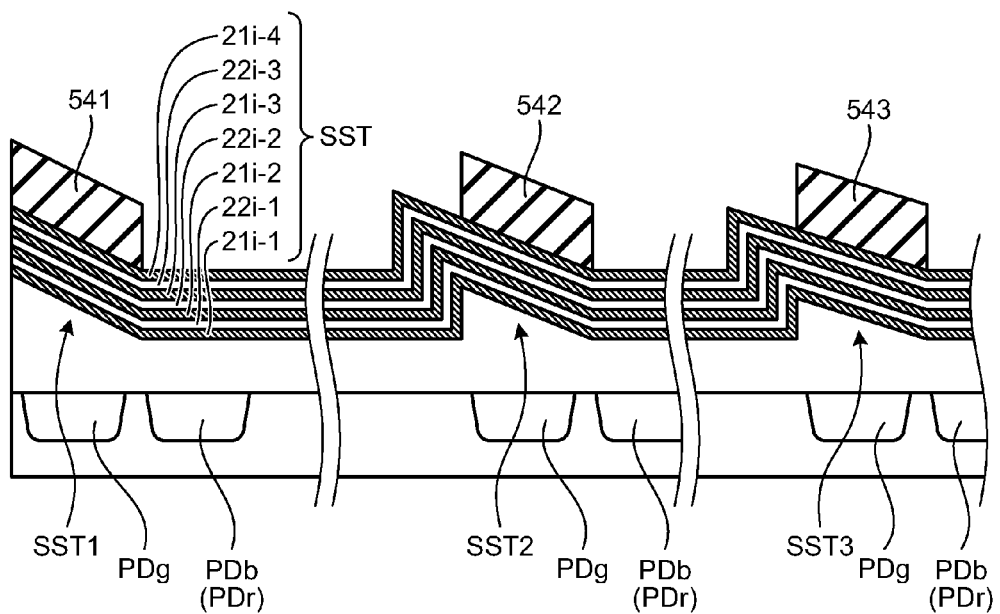
FIGS. 12A and 12B are diagrams showing the manufacturing method of the solid-state imaging device according to the first embodiment.

In the step shown in FIG. 12A, a laminated structure SST to be the dichroic filters DF (multi-layer interference filters 20g) is formed of photonic crystals of inorganic material. Specifically, a first layer 21i-1, a second layer 22i-1, a first layer 21i-2, a second layer 22i-2, a first layer 21i-3, a second layer 22i-3, and a first layer 21i-4 are sequentially deposited to be formed by a sputtering method or the like. The first layers 21i-1, 21i-2, 21i-3, 21i-4 are formed of, e.g., titanium oxide ($TiO_2$). The first layers 21i-1, 21i-2, 21i-3, 21i-4 are formed to have similar film thickness to each other.

The second layers 22i-1, 22i-2, 22i-3 are formed of, e.g., silicon oxide ($SiO_2$).

For example, each first layer 21i-1 to 21i-4 is formed to have, e.g., such a film thickness that its optical film thickness is one fourth of the center wavelength (e.g., 550 nm). That is, each first layer 21i-1 to 21i-4 is formed to have a film thickness d1 that satisfies:

$$n1 \times d1 = (1/4) \times \lambda \qquad \text{equation 1}$$

where n1 is the refractive index of the material (e.g., $TiO_2$), and λ is the center wavelength. For example, when substituting n1=2.5 and λ=550 nm into the equation 1, d1=55 nm.

Each second layer 22i-1, 22i-3 is formed to have, e.g., such a film thickness that its optical film thickness is one fourth of the center wavelength (e.g., 550 nm). That is, each second layer 22i-1, 22i-3 is formed to have a film thickness d2 that satisfies:

$$n2 \times d2 = (1/4) \times \lambda \qquad \text{equation 2}$$

where n2 is the refractive index of the material (e.g., $SiO_2$), and λ is the center wavelength. For example, when substituting n2=1.46 and λ=550 nm into the equation 2, d2=94 nm.

In contrast, the second layer (spacer layer) 22i-2 is formed to have a film thickness of, e.g., 35 nm so that the multi-layer interference filter 20g has a peak of spectral transmittance in the wavelength range of green (G).

Then, a resist pattern 541 to 543 covering parts of the laminated structure SST corresponding to and over photoelectric conversion portions PDg, that is, parts SST1 to SST3 to be dichroic filters DF is formed by lithography.

Figure 12B:
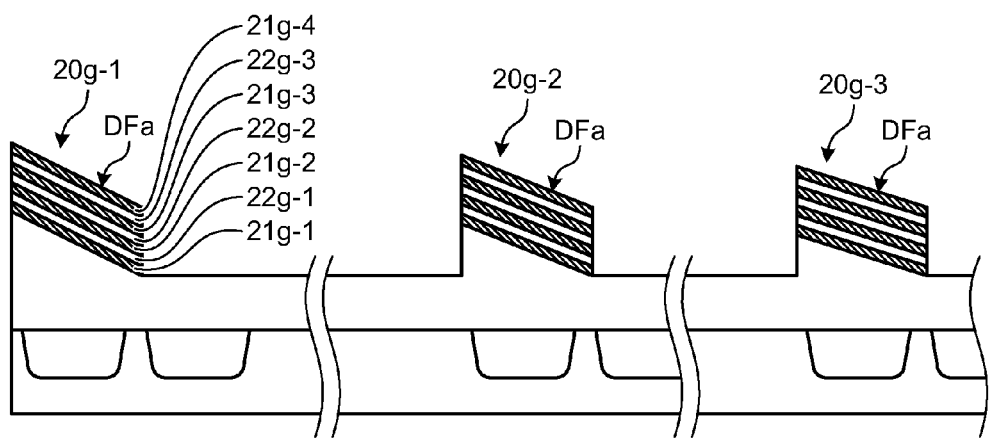

In the step shown in FIG. 12B, anisotropic etching is performed by an RIE method using, e.g., $CF_4$-based gas. Thereby the laminated structure SST is patterned with the resist pattern 541 to 543 as a mask to form multi-layer interference filters 20g.

For example, a multi-layer interference filter 20g-1 having the light incidence surface DFa inclined at an angle substantially equal to the inclination angle α1 (see FIG. 7) is formed in the position where the dichroic filter DF of the pixel Pgb1 of the center region CA (see FIG. 8) is to be formed.

For example, a multi-layer interference filter 20g-2 having the light incidence surface DFa inclined at an angle substantially equal to the inclination angle α2 (see FIG. 7) is formed in the position where the dichroic filter DF of the pixel Pgb2 of the periphery region PA or PA1 (see FIG. 8) is to be formed.

For example, a multi-layer interference filter 20g-3 having the light incidence surface DFa inclined at an angle substantially equal to the inclination angle α3 (see FIG. 7) is formed in the position where the dichroic filter DF of the pixel Pgb3 of the periphery region PA2 (see FIG. 8) is to be formed.

In the step shown in FIG. 13A, an insulating film 30i to be the insulating film 30g is deposited all over. The insulating film 30i is formed of material (e.g., silicon nitride) different in refractive index from that of any of the first layers 21i-1 to 21i-4 and the second layers 22i-1 to 22i-3.

In the step shown in FIG. 13B, anisotropic etching is performed by an RIE method to remove the other parts of the insulating film 30i with leaving the insulating film 30g on the side surfaces of the multi-layer interference filters 20g.

That is, multiple dichroic filters DF are formed to be along the inclined surface patterns 511 to 513 through the steps shown in FIG. 12A, 12B and FIG. 13A, 13B.

Then, an insulating film is deposited all over so as to cover each dichroic filter DF, and openings 55a are formed in positions for plugs PL to be buried in. Thus, the insulating film pattern 55 to be bases for the reflective structures RS is formed. At this time, the area corresponding to the inclined reflective surface RSa of the inner side surface of the opening 55a is formed to incline at an angle substantially equal to the inclination angle of the inclined reflective surface RSa by taper etching. At this time, the taper angle should be set at an angle in the range of, e.g., 60° to 75°.

For example, an opening 55a having an inclined inner side surface 55a1 inclined at an angle substantially equal to the inclination angle β1 (see FIG. 7) is formed in the position where the reflective structure RS of the pixel Pgb1 of the center region CA (see FIG. 8) is to be formed.

For example, an opening 55a having an inclined inner side surface 55a1 inclined at an angle substantially equal to the inclination angle β2 (see FIG. 7) is formed in the position where the reflective structure RS of the pixel Pgb2 of the periphery region PA or PA1 (see FIG. 8) is to be formed.

For example, an opening 55a having an inclined inner side surface 55a1 inclined at an angle substantially equal to the inclination angle β3 (see FIG. 7) is formed in the position where the reflective structure RS of the pixel Pgb3 of the periphery region PA2 (see FIG. 8) is to be formed.

Figure 14A:
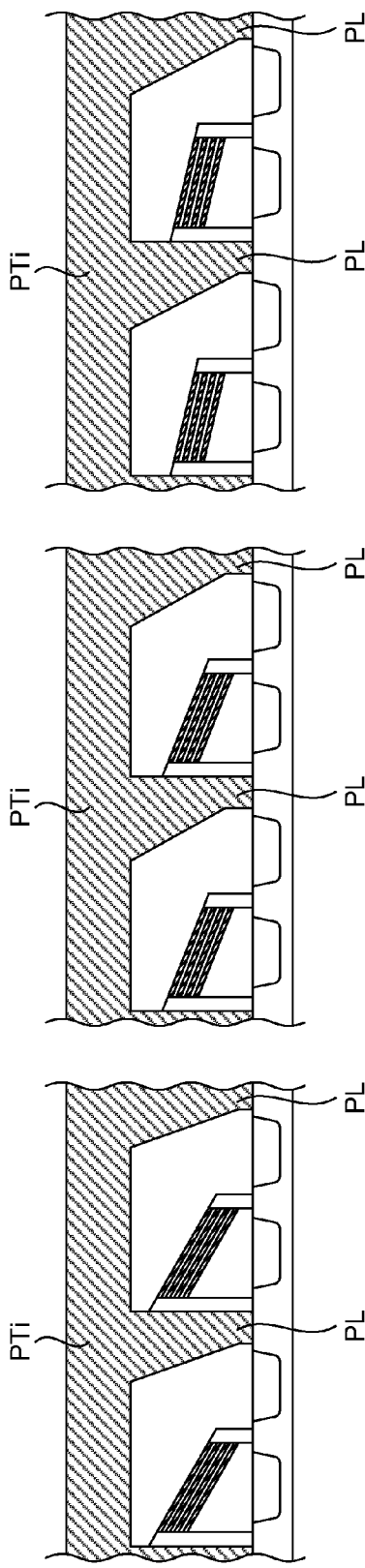
FIGS. 14A and 14B are diagrams showing the manufacturing method of the solid-state imaging device according to the first embodiment.

In the step shown in FIG. 14A, the openings 55a are filled by a sputtering method to form plugs PL. The plugs PL are formed of, e.g., metal containing tungsten as a main component. Further, a metal film PTi is deposited all over by a sputtering method to cover the insulating film pattern 55 and plugs PL. Then, the upper surface thereof is flattened by a CMP method. The metal film PTi is formed of, e.g., metal containing aluminum and/or silver as a main component.

Figure 14B:
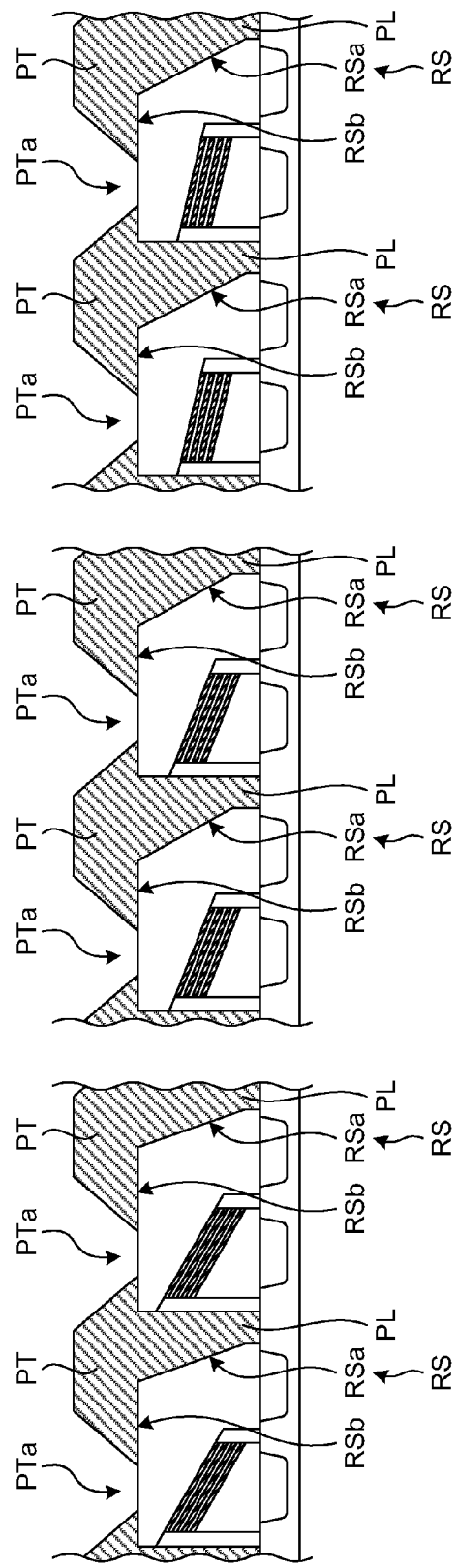

In the step shown in FIG. 14B, a resist pattern (not shown) having openings corresponding to the openings PTa is formed by lithography. Etching is performed by an RIE method with the resist pattern as a mask to form the openings PTa in the metal film PTi to form a metal-film pattern PT. Thus, the reflective structures RS having the reflective surface RSb and the inclined reflective surface RSa are formed.

In the step shown in FIG. 7, the flattened film FL covering the metal-film pattern PT and the insulating film pattern 55 (see FIG. 13B) is formed. Then, the organic color filter films CFcy, CFye are formed on the flattened film FL, and the micro-lenses ML are formed on the organic color filter films CFcy, CFye. Thus, the solid-state imaging device 5 is formed.

As described above, in the first embodiment, in the solid-state imaging device 5, the inclination angle relative to the Z axis direction of the light incidence surface DFa of the dichroic filter DF in the pixels of the center region CA and the inclination angle relative to the Z axis direction of the light incidence surface DFa of the dichroic filter DF in the pixels of the periphery region PA are decided on so as to make, for light incident on the imaging region IR, the filter property of the dichroic filter DF in the pixels of the center region CA and the filter property of the dichroic filter DF in the pixels of the periphery region PA equalized. For example, the inclination angle relative to the Z axis direction of the light incidence surface DFa of the dichroic filter DF in the pixels of the periphery region PA is greater than the inclination angle relative to the Z axis direction of the light incidence surface DFa of the dichroic filter DF in the pixels of the center region CA. That is, the inclination angle of the light incidence surface DFa of the dichroic filter DF relative to the Z axis direction (a direction along the normal to the surface of the semiconductor substrate) is increased in accordance with a pixel position being farther from the center CP of the imaging region IR. Thus, the light incident angle to the light incidence surface DFa of the dichroic filter DF in the pixels of the periphery region PA can be made close to the light incident angle to the light incidence surface DFa of the dichroic filter DF in the pixels of the center region CA. As a result, the amount of received light of the photoelectric conversion portion (first photoelectric conversion portion) PDg in the pixels of the periphery region PA can be made close to the amount of received light of the photoelectric conversion portion (first photoelectric conversion portion) PDg in the pixels of the center region CA. Therefore, the occurrence of shading in the solid-state imaging device 5 can be suppressed.

In the first embodiment, in the solid-state imaging device 5, by making the light incident angle to the light incidence surface DFa of the dichroic filter DF in the pixels of the periphery region PA close to the light incident angle to the light incidence surface DFa of the dichroic filter DF in the pixels of the center region CA, the peak wavelength of spectral transmittance of the dichroic filter DF in the pixels of the periphery region PA can be made close to the peak wavelength of spectral transmittance of the dichroic filter DF in the pixels of the center region CA. As a result, decrease in the color reproducibility in the solid-state imaging device 5 can be suppressed, so that degradation in the picture quality of the image obtained from the image signal acquired by the solid-state imaging device 5 can be suppressed.

Further, in the first embodiment, in the solid-state imaging device 5, for example, the inclination angle relative to the Z axis direction of the light incidence surface DFa of the dichroic filter DF in the pixels of the periphery region PA1 is greater than the inclination angle relative to the Z axis direction of the light incidence surface DFa of the dichroic filter DF in the pixels of the center region CA. The inclination angle relative to the Z axis direction of the light incidence surface DFa of the dichroic filter DF in the pixels of the periphery region PA2 is greater than the inclination angle relative to the Z axis direction of the light incidence surface DFa of the dichroic filter DF in the pixels of the periphery region PA1. That is, the inclination angle of the light incidence surface DFa of the dichroic filter DF relative to the Z axis direction (a direction along the normal to the surface of the semiconductor substrate) is increased stepwise in accordance with a pixel position going farther from the center CP of the imaging region IR. Thus, the light incident angle to the light incidence surface DFa of the dichroic filter DF in the pixels of the periphery region PA1 and that of the dichroic filter DF in the pixels of the periphery region PA2 can each be made close to the light incident angle to the light incidence surface DFa of the dichroic filter DF in the pixels of the center region CA. As a result, the amount of received light of the photoelectric conversion portion (first photoelectric conversion portion) PDg in the pixels of the periphery region PA1 and that of the photoelectric conversion portion (first photoelectric conversion portion) PDg in the pixels of the periphery region PA2 can each be made close to the amount of received light of the photoelectric conversion portion (first photoelectric conversion portion) PDg in the pixels of the center region CA. Therefore, the occurrence of shading in the solid-state imaging device 5 can be further suppressed.

In the first embodiment, in the solid-state imaging device 5, by making the light incident angle to the light incidence surface DFa of the dichroic filter DF in the pixels of the periphery region PA1 and that of the dichroic filter DF in the pixels of the periphery region PA2 each close to the light incident angle to the light incidence surface DFa of the dichroic filter DF in the pixels of the center region CA, the peak wavelength of spectral transmittance of the dichroic filter DF in the pixels of the periphery region PA1 and that of the dichroic filter DF in the pixels of the periphery region PA2 can each be made close to the peak wavelength of spectral transmittance of the dichroic filter DF in the pixels of the center region CA. As a result, decrease in the color reproducibility in the solid-state imaging device 5 can be further suppressed, so that degradation in the picture quality of the image obtained from the image signal acquired by the solid-state imaging device 5 can be further suppressed.

Further, in the solid-state imaging device 5 of the first embodiment, for example, the inclination angle relative to the Z axis direction of the inclined reflective surface RSa of the reflective structure RS in the pixels of the periphery region PA is greater than the inclination angle relative to the Z axis direction of the inclined reflective surface RSa of the reflective structure RS in the pixels of the center region CA. Thus, the inclination angle of the inclined reflective surface RSa of the reflective structure RS relative to the Z axis direction (a direction along the normal to the surface of the semiconductor substrate) can be increased in accordance with a pixel position being farther from the center CP of the imaging region IR. As a result, the amount of received light of the photoelectric conversion portion (second photoelectric conversion portion) PDb, PDr in the pixels of the periphery region PA can be made close to the amount of received light of the photoelectric conversion portion (second photoelectric conversion portion) PDb, PDr in the pixels of the center region CA. Therefore, the occurrence of shading in the solid-state imaging device 5 can be suppressed.

Further, in the first embodiment, in the solid-state imaging device 5, for example, the inclination angle relative to the Z axis direction of the inclined reflective surface RSa of the reflective structure RS in the pixels of the periphery region PA1 is greater than the inclination angle relative to the Z axis direction of the inclined reflective surface RSa of the reflective structure RS in the pixels of the center region CA. The inclination angle relative to the Z axis direction of the inclined reflective surface RSa of the reflective structure RS in the pixels of the periphery region PA2 is greater than the inclination angle relative to the Z axis direction of the inclined reflective surface RSa of the reflective structure RS in the pixels of the periphery region PA1. Thus, the inclination angle of the inclined reflective surface RSa of the reflective structure RS relative to the Z axis direction (a direction along the normal to the surface of the semiconductor substrate) can be increased stepwise in accordance with a pixel position being farther from the center CP of the imaging region IR. As a result, the amount of received light of the photoelectric conversion portion (second photoelectric conversion portion) PDb, PDr in the pixels of the periphery region PA1 and that of the photoelectric conversion portion (second photoelectric conversion portion) PDb, PDr in the pixels of the periphery region PA2 can each be made close to the amount of received light of the photoelectric conversion portion (second photoelectric conversion portion) PDb, PDr in the pixels of the center region CA. Therefore, the occurrence of shading in the solid-state imaging device 5 can be further suppressed.

In the first embodiment, one pixel worth of a pixel signal can be read out for each of four colors (R, Gr, B, Gb), which form a unit of the Bayer array, from two pixels (total: 4×1=4 pixels worth). That is, compared with the basic configuration where one micro-lens ML is provided for each photoelectric conversion portion PD to form one pixel, the sensitivity to each of four colors (R, Gr, B, Gb) can be approximately doubled. Thus, the sensitivity of each of four colors (R, Gr, B, Gb) can be easily improved.

It should be noted that, although in the first embodiment the case where each dichroic filter DF mainly has the multi-layer interference filter 20g has been described illustratively, the dichroic filter DF may have another configuration as long as it has a function of transmitting light of the first color (e.g., green) to guide the light of the first color to the photoelectric conversion portion PDg and of reflecting light of the second color (e.g., blue or red) to guide the light of the second color to the photoelectric conversion portion PDb, PDr. For example, the dichroic filter DF may have a reflective film having wavelength selectivity (i.e., selectively transmitting light of green) instead of the multi-layer interference filter 20g.

Figure 15:
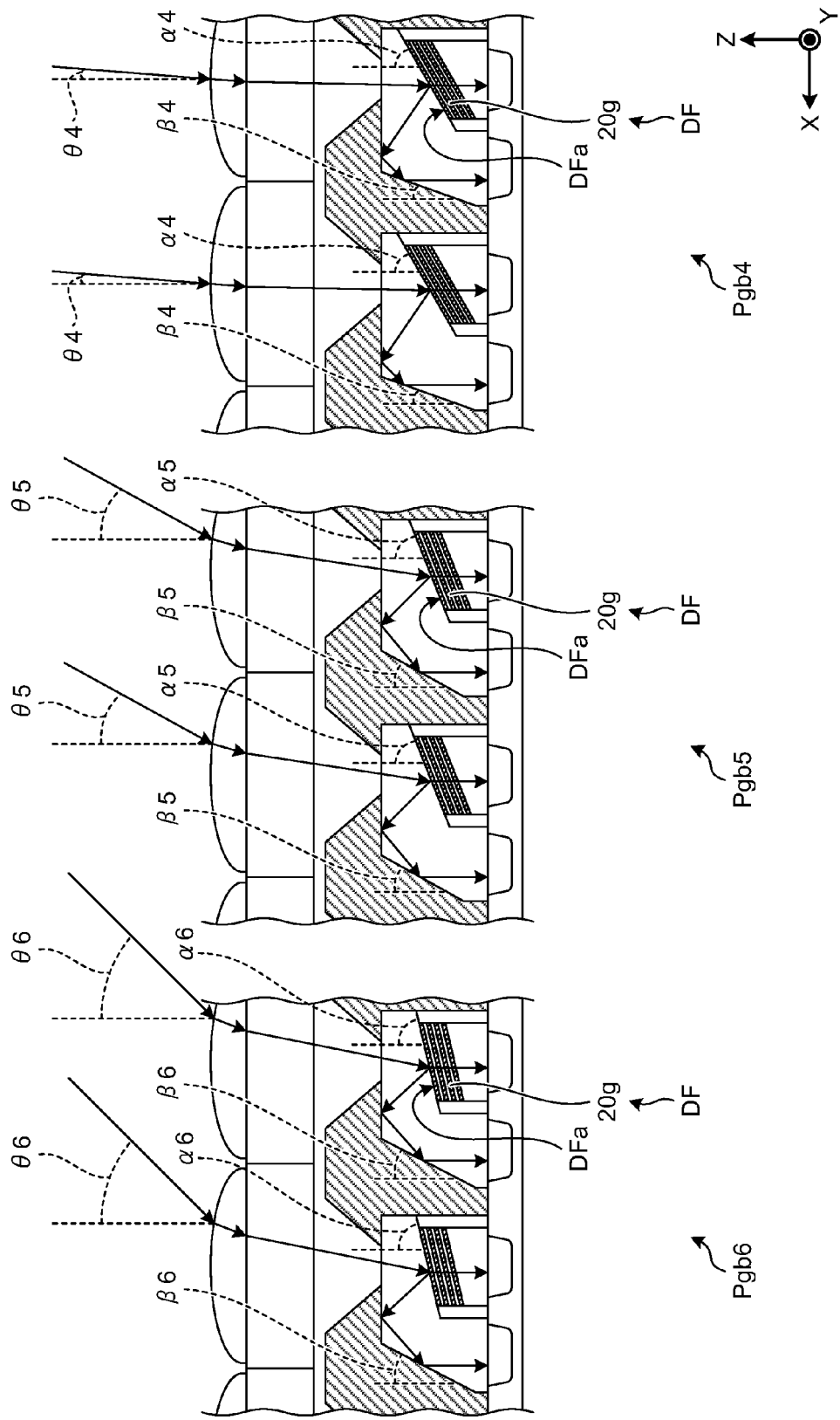
FIG. 15 is a diagram showing the inclination angle of the light incidence surface of the dichroic filter according to the position of a pixel in a modified example of the first embodiment.

Or in the solid-state imaging device 5, the inclination orientation of the light incidence surface DFa of the dichroic filter DF may also be changed according to the direction in which going farther from the center CP of the imaging region IR. That is, as shown in FIG. 15, from among the plurality of pixels, the inclination orientations of the light incidence surfaces DFa of the dichroic filters DF in pixels located on opposite sides of the center CP of the imaging region IR may be made opposite. FIG. 15 is a diagram showing the inclination angle of the light incidence surface DFa of the dichroic filter DF according to the position of a pixel.

For example, a pixel Pgb4 is placed on the opposite side of the center CP of the imaging region IR from the pixel Pgb1 and in a position corresponding to the pixel Pgb1 (see FIG. 8). In the pixel Pgb4, the light incidence surface DFa of the dichroic filter DF is inclined in the opposite direction to that of the light incidence surface DFa of the dichroic filter DF in the pixel Pgb1 (see FIG. 7). Likewise, a pixel Pgb5 is placed on the opposite side of the center CP of the imaging region IR from the pixel Pgb2 and in a position corresponding to the pixel Pgb2 (see FIG. 8). In the pixel Pgb5, the light incidence surface DFa of the dichroic filter DF is inclined in the opposite direction to that of the light incidence surface DFa of the dichroic filter DF in the pixel Pgb2 (see FIG. 7).

Here, as shown in FIG. 15, from among the plurality of pixels, the inclination angle relative to the Z axis direction of the light incidence surface DFa of the dichroic filter DF in the pixels of the periphery region PA can be made greater than the inclination angle relative to the Z axis direction of the light incidence surface DFa of the dichroic filter DF in the pixels of the center region CA. Taking into account the orientation of the light incident angle as well, the angle when inclining in a −X direction relative to the Z axis direction can be taken as a negative angle.

For example, the dichroic filters DF (the multi-layer interference filters 20g) in the pixels Pgb4, Pgb5 shown in FIG. 15 are both placed to selectively guide light of green (G) to the photoelectric conversion portion PDg. The pixel Pgb4 is included in the center region CA, and the pixel Pgb5 is included in the periphery region PA (see FIG. 8). That is, the pixel Pgb5 is placed farther from the center CP of the imaging region IR than the pixel Pgb4. In the pixel Pgb4 of the center region CA, the dichroic filter DF has a light incidence surface DFa inclined at an inclination angle $\alpha 4$ relative to the Z axis direction correspondingly to the light incident angle $\theta 4$ to the micro-lens ML. In the pixel Pgb5 of the periphery region PA, the dichroic filter DF has a light incidence surface DFa inclined at an inclination angle $\alpha 5$ ($|\alpha 5|>|\alpha 4|$) relative to the Z axis direction correspondingly to the light incident angle $\theta 5$ ($|\theta 5|>|\theta 4|$) to the micro-lens ML. That is, the absolute value of the inclination angle $\alpha 5$ of the light incidence surface DFa of the dichroic filter DF in the pixel Pgb5 of the periphery region PA is greater than the absolute value of the inclination angle $\alpha 4$ of the light incidence surface DFa of the dichroic filter DF in the pixel Pgb4 of the center region CA.

Thus, the light incident angle to the light incidence surface DFa of the dichroic filter DF in the pixel Pgb5 of the periphery region PA can be made close to the light incident angle to the light incidence surface DFa of the dichroic filter DF in the pixel Pgb4 of the center region CA so as to make, for light incident on the imaging region IR, the filter property of the dichroic filter DF (the multi-layer interference filters 20g) in the pixel Pgb5 of the periphery region PA and the filter property of the dichroic filter DF (the multi-layer interference filters 20g) in the pixel Pgb4 of the center region CA equalized. As a result, the amount of received light of the photoelectric conversion portion PDg in the pixel Pgb5 of the periphery region PA can be made close to the amount of received light of the photoelectric conversion portion PDg in the pixel Pgb4 of the center region CA. Therefore, the occurrence of shading in the solid-state imaging device 5 can be further suppressed.

Further, if as to the light incident angle θ4 to the micro-lens ML in the pixel Pgb4, |θ4|≈|θ1| and the signs of θ4 and θ1 are opposite (see FIG. 7), for the inclination angle α4 of the light incidence surface DFa of the dichroic filter DF in the pixel Pgb4 of the center region CA, the following equation 3 may hold.

$$|\alpha 4|\approx|\alpha 1|.\text{(the signs of }\alpha 4\text{ and }\alpha 1\text{ are opposite)} \quad \text{equation 3}$$

That is, the absolute value of the inclination angle α4 of the light incidence surface DFa of the dichroic filter DF in the pixel Pgb4 may be substantially equal to the absolute value of the inclination angle α1 (see FIG. 7) of the light incidence surface DFa of the dichroic filter DF in the pixel Pgb1.

Likewise, if as to the light incident angle θ5 to the micro-lens ML in the pixel Pgb5, |θ5|≈|θ2| and the signs of θ5 and θ2 are opposite (see FIG. 7), for the inclination angle α5 of the light incidence surface DFa of the dichroic filter DF in the pixel Pgb5 of the periphery region PA, the following equation 4 may hold.

$$|\alpha 5|\approx|\alpha 2|.\text{(the signs of }\alpha 5\text{ and }\alpha 2\text{ are opposite)} \quad \text{equation 4}$$

That is, the absolute value of the inclination angle α5 of the light incidence surface DFa of the dichroic filter DF in the pixel Pgb5 may be substantially equal to the absolute value of the inclination angle α2 (see FIG. 7) of the light incidence surface DFa of the dichroic filter DF in the pixel Pgb2.

In this case, the absolute value of the light incident angle to the light incidence surface DFa of the dichroic filter DF in the pixel Pgb4 of the center region CA can be made close to the absolute value of the light incident angle to the light incidence surface DFa of the dichroic filter DF in the pixel Pgb1 of the center region CA. The absolute value of the light incident angle to the light incidence surface DFa of the dichroic filter DF in the pixel Pgb5 of the periphery region PA can be made close to the absolute value of the light incident angle to the light incidence surface DFa of the dichroic filter DF in the pixel Pgb2 of the periphery region PA. Thus, the filter property of the dichroic filter DF (the multi-layer interference filters 20g) in the pixel Pgb4 of the center region CA and the filter property of the dichroic filter DF (the multi-layer interference filters 20g) in the pixel Pgb1 of the center region CA can be made equalized. The filter property of the dichroic filter DF (the multi-layer interference filters 20g) in the pixel Pgb5 of the periphery region PA and the filter property of the dichroic filter DF (the multi-layer interference filters 20g) in the pixel Pgb2 of the periphery region PA can be made equalized. As a result, the amount of received light of the photoelectric conversion portion PDg in the pixel Pgb4 of the center region CA can be made close to the amount of received light of the photoelectric conversion portion PDg in the pixel Pgb1 of the center region CA. The amount of received light of the photoelectric conversion portion PDg in the pixel Pgb5 of the periphery region PA can be made close to the amount of received light of the photoelectric conversion portion PDg in the pixel Pgb2 of the periphery region PA. Therefore, the occurrence of shading in the solid-state imaging device 5 can be further suppressed.

Further, for example, a pixel Pgb6 is placed on the opposite side of the center CP of the imaging region IR from the pixel Pgb3 and in a position corresponding to the pixel Pgb3 (see FIG. 8). In the pixel Pgb6, the light incidence surface DFa of the dichroic filter DF inclines in the opposite direction to that of the light incidence surface DFa of the dichroic filter DF in the pixel Pgb3 (see FIG. 7).

Here, as shown in FIG. 15, from among the plurality of pixels, the absolute value of the inclination angle relative to the Z axis direction of the light incidence surface DFa of the dichroic filter DF in the pixels of the center region CA, the absolute value of the inclination angle relative to the Z axis direction of the light incidence surface DFa of the dichroic filter DF in the pixels of the periphery region PA1, and the absolute value of the inclination angle relative to the Z axis direction of the light incidence surface DFa of the dichroic filter DF in the pixels of the periphery region PA2 may be made greater than one another by steps.

For example, the dichroic filters DF (the multi-layer interference filters 20g) in the pixels Pgb4, Pgb5, Pgb6 shown in FIG. 15 are all placed to selectively guide light of green (G) to the photoelectric conversion portion PDg. The pixel Pgb4 is included in the center region CA; the pixel Pgb5 is included in the periphery region PA1; and the pixel Pgb6 is included in the periphery region PA2 (see FIG. 8). That is, the pixel Pgb5 is placed farther from the center CP of the imaging region IR than the pixel Pgb4. The pixel Pgb6 is placed farther from the center CP of the imaging region IR than the pixel Pgb5. In the pixel Pgb4 of the center region CA, the dichroic filter DF has a light incidence surface DFa inclined at an inclination angle α4 relative to the Z axis direction correspondingly to the light incident angle θ4 to the micro-lens ML. In the pixel Pgb5 of the periphery region PA1, the dichroic filter DF has a light incidence surface DFa inclined at an inclination angle α5 (|α5|>|α4|) relative to the Z axis direction correspondingly to the light incident angle θ5 (|θ5|>|θ4|) to the micro-lens ML. In the pixel Pgb6 of the periphery region PA2, the dichroic filter DF has a light incidence surface DFa inclined at an inclination angle α6 (|α6|>|α5|) relative to the Z axis direction correspondingly to the light incident angle θ6 (|θ6|>|θ5|) to the micro-lens ML. That is, the absolute value of the inclination angle α4 of the light incidence surface DFa of the dichroic filter DF in the pixel Pgb4 of the center region CA, the absolute value of the inclination angle α5 of the light incidence surface DFa of the dichroic filter DF in the pixel Pgb5 of the periphery region PA1, and the absolute value of the inclination angle α6 of the light incidence surface DFa of the dichroic filter DF in the pixel Pgb6 of the periphery region PA2 can be made greater than one another in a multi-stepwise fashion.

Thus, the absolute value of the light incident angle to the light incidence surface DFa of the dichroic filter DF in the pixel Pgb5 of the periphery region PA1 can be made close to the absolute value of the light incident angle to the light incidence surface DFa of the dichroic filter DF in the pixel Pgb4 of the center region CA. The absolute value of the light incident angle to the light incidence surface DFa of the dichroic filter DF in the pixel Pgb6 of the periphery region PA2 can be made close to the absolute value of the light incident angle to the light incidence surface DFa of the dichroic filter DF in the pixel Pgb4 of the center region CA.

Further, in addition to holding of the above equations 3, 4, the following equation 5 may hold. That is, if as to the light incident angle θ6 to the micro-lens ML in the pixel Pgb6, |θ6|≈|θ3| and the signs of θ6 and θ3 are opposite (see FIG. 7), for the inclination angle α6 of the light incidence surface DFa of the dichroic filter DF in the pixel Pgb6 of the periphery region PA2, the following equation 5 may hold.

$$|\alpha 6|\approx|\alpha 3|.\text{(the signs of }\alpha 6\text{ and }\alpha 3\text{ are opposite)} \quad \text{equation 5}$$

That is, the absolute value of the inclination angle α6 of the light incidence surface DFa of the dichroic filter DF in the pixel Pgb6 may be substantially equal to the absolute value of the inclination angle α3 (see FIG. 7) of the light incidence surface DFa of the dichroic filter DF in the pixel Pgb3.

In this case, the absolute value of the light incident angle to the light incidence surface DFa of the dichroic filter DF in the pixel Pgb6 of the periphery region PA2 can be made close to the absolute value of the light incident angle to the light incidence surface DFa of the dichroic filter DF in the pixel Pgb3 of the periphery region PA2. Thus, the filter property of the dichroic filter DF (the multi-layer interference filters 20g) in the pixel Pgb6 of the periphery region PA2 and the filter property of the dichroic filter DF (the multi-layer interference filters 20g) in the pixel Pgb3 of the periphery region PA2 can be made equalized. As a result, the amount of received light of the photoelectric conversion portion PDg in the pixel Pgb6 of the periphery region PA2 can be made close to the amount of received light of the photoelectric conversion portion PDg in the pixel Pgb3 of the periphery region PA2. Therefore, the occurrence of shading in the solid-state imaging device 5 can be further suppressed.

Second Embodiment

Next, a solid-state imaging device 205 according to the second embodiment will be described. Description will be made below focusing on the differences from the first embodiment.

In the first embodiment, because the multi-layer interference filter 20g having a peak of spectral transmittance in the wavelength range of green is used as the dichroic filter DF, as shown in FIG. 16A, reflectivity on the long wavelength side tends to be short of required reflectivity. Hence, sensitivity on the red side may be reduced.

Figure 16B:
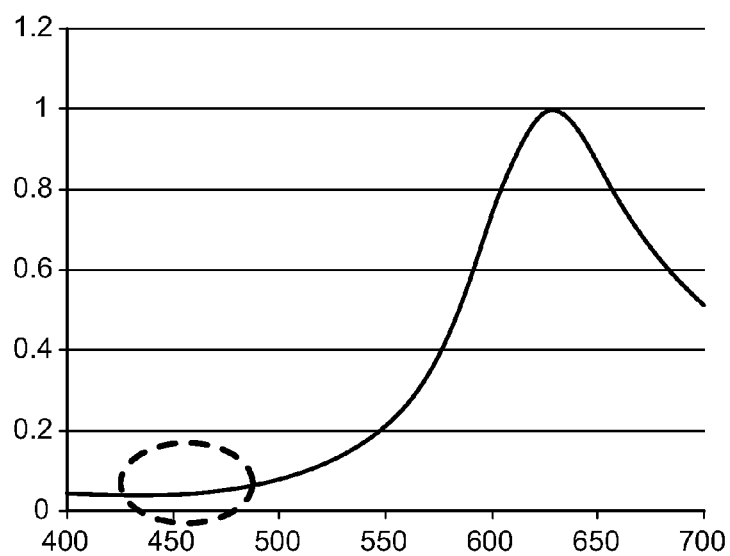

The multi-layer interference filter 20g is a filter that transmits light of green (G), and the transmittance to light of blue (B) is low as seen from the spectral characteristic of FIG. 16A. That is, the reflectivity to light of blue (B) is high, but the transmittance to light of red (R) is greater than the transmittance to light of blue (B), that is, the reflectivity to light of red (R) is lower. That is, the multi-layer interference filter 20g tends to be basically worse in reflectivity to wavelengths longer than transmission wavelengths. Hence, where light is reflected to separate, reflection efficiency can be increased with reflecting wavelengths shorter than transmission wavelengths. By changing the thickness of the spacer layer 22g-2 in the multi-layer interference filter 20g from 35 nm to 85 nm, it can be changed into a multi-layer interference filter 20r transmitting light of red (R) as shown in FIG. 16B.

However, when considering the current Bayer array, light of green (G) and light of blue (B) need to be separated, and hence it is difficult to use the multi-layer interference filter 20r transmitting light of red (R) as the dichroic filter DF instead of the multi-layer interference filter 20g of the first embodiment. That is, the reflectivity to light of green (G) of the multi-layer interference filter 20r tends to be short of required reflectivity as shown in FIG. 16B.

Accordingly, the second embodiment uses the multi-layer interference filter 20r having a peak of spectral transmittance in the wavelength range of red (R) as the dichroic filter DF and separates light of green (G) with an organic photoelectric conversion film instead of the dichroic filter DF.

Specifically, in the solid-state imaging device 205, as shown in FIGS. 17A to 17D, each of multiple pixels corresponds to three colors (red, green, blue). FIGS. 17A to 17D are diagrams showing arrangements of multiple pixels Prgb(1, 1) to Prgb(3, 6) in the solid-state imaging device 205.

Figure 17A:
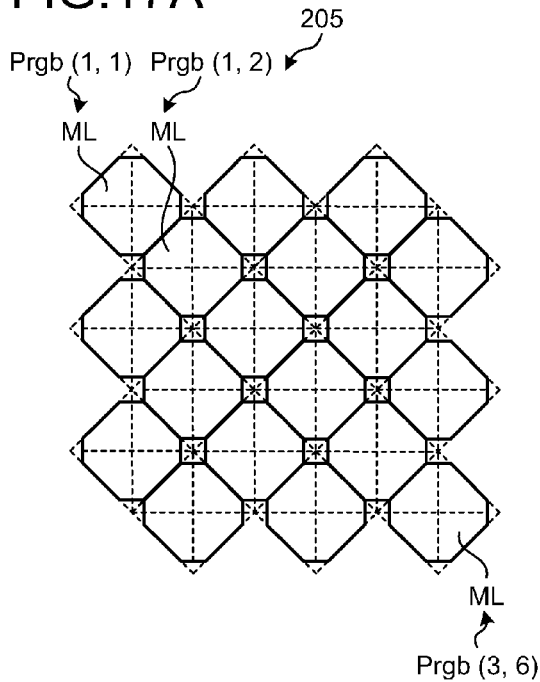
FIGS. 17A to 17D are diagrams showing the arrangements of a plurality of pixels in the second embodiment.
Figure 17B:
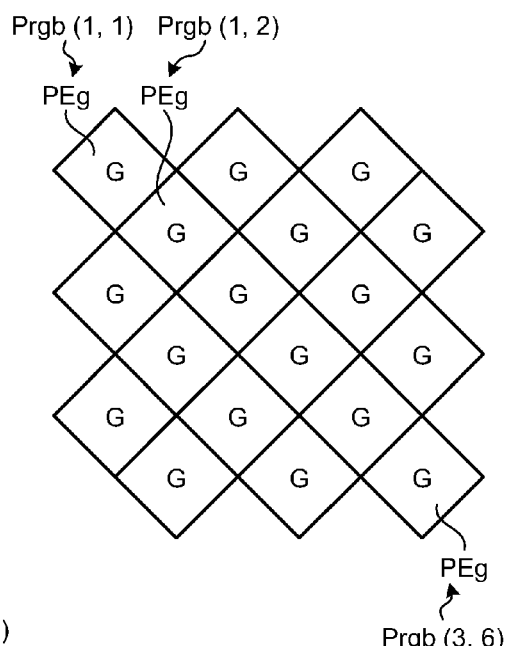

Each pixel Prgb(1, 1) to Prgb(3, 6) has the organic photoelectric conversion film PEg instead of the organic color filter film CFcy, CFye (see FIG. 5) as shown in FIG. 17B. The organic photoelectric conversion film PEg photo-electrically converts light of a third color (e.g., green) out of light having passed through the micro-lens ML with transmitting light of a first color (e.g., red) and light of a second color (e.g., blue).

Figure 17C:
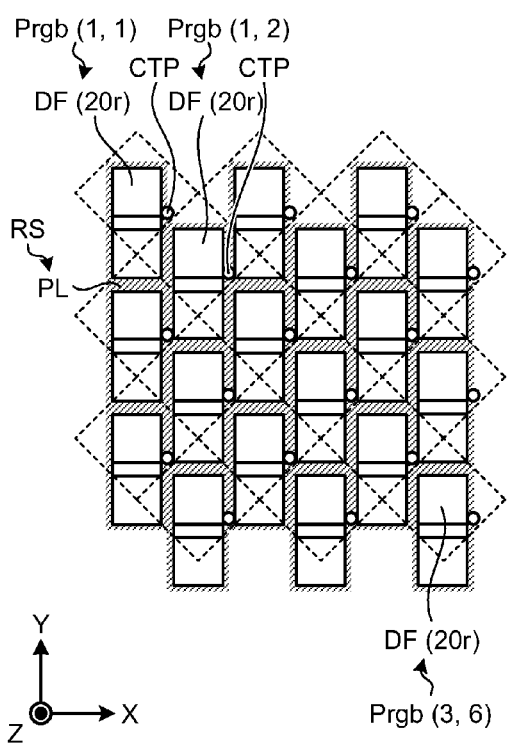

Each pixel Prgb(1, 1) to Prgb(3, 6), as shown in FIG. 17C, uses the multi-layer interference filter 20r having a peak of spectral transmittance in the wavelength range of red as the dichroic filter DF instead of the multi-layer interference filter 20g (see FIG. 5) having a peak of spectral transmittance in the wavelength range of green. The multi-layer interference filter 20r is different from the multi-layer interference filter 20g in that the film thickness of the spacer layer 22g-2 is a film thickness for red (e.g., 85 nm), but similar to the multi-layer interference filter 20g in the others. Thus, in each pixel Prgb, the dichroic filter DF transmits light of red (the first color) out of light having passed through the organic photoelectric conversion film PEg to guide the light of red to the photoelectric conversion portion PDr and reflects light of blue (the second color) to guide the light of blue to the photoelectric conversion portion PDb.

Each pixel Prgb(1, 1) to Prgb(3, 6) further has a contact plug CTP as shown in FIG. 17C. The contact plug CTP electrically connects the organic photoelectric conversion film PEg and a charge holding portion SDg (see FIG. 18) in the semiconductor substrate SB. The organic photoelectric conversion film PEg is covered at the top by a common electrode film VB (see FIG. 18) and covered at the bottom by a pixel electrode film OPDg (see FIG. 18). The pixel electrode film OPDg is electrically separated into respective parts for pixels by an insulating film 61 (see FIG. 19). Such a bias is applied across the common electrode film VB and the pixel electrode film OPDg that charge generated in the organic photoelectric conversion film PEg is collected at the pixel electrode film OPDg. Thus, charge generated in the organic photoelectric conversion film PEg in response to light of the third color (e.g., green) can be transferred to the charge holding portion SDg via the contact plug CTP. The contact plug CTP has an insulating film formed at the interface with the plug PL forming part of the reflective structure RS so as to be electrically insulated from the plug PL, and the pixel electrode film OPDg has an insulating film formed at the interface with the metal-film pattern PT forming part of the reflective structure RS so as to be electrically insulated from the metal-film pattern PT.

Figure 17D:
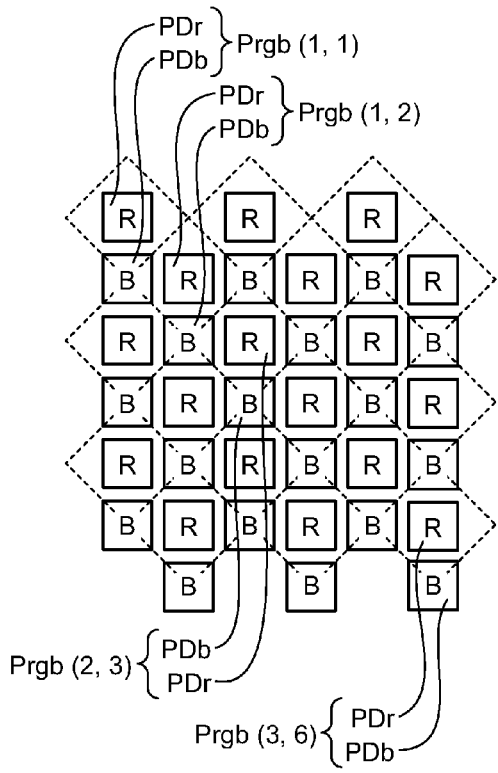

In the arrangement of the multiple photoelectric conversion portions PDr, PDb, the photoelectric conversion portions PDr for red and the photoelectric conversion portions PDb for blue are arranged in a staggered pattern as shown in FIG. 17D.

The photoelectric conversion portion PDr of each pixel Prgb receives light of the first color (e.g., red) having passed through the dichroic filter DF to generate and store charges according to the amount of the light. The photoelectric conversion portion PDr is, for example, a photodiode.

The photoelectric conversion portion PDb of each pixel Prgb receives light of the second color (e.g., blue) reflected by the dichroic filter DF and further reflected by the reflective structure RS to generate and store charges according to the amount of the light. The photoelectric conversion portion PDb is, for example, a photodiode.

In this way, a laminated structure is formed to make the organic photoelectric conversion film PEg absorb light of the third color (e.g., green) and transmit light of the first color (e.g., red) and light of the second color (e.g., blue) to guide the lights of the first and second colors to the dichroic filter DF. The dichroic filter DF (the multi-layer interference filter 20r) transmits light of red (the first color) to guide the light of red to the photoelectric conversion portion PDr and reflects light of blue (the second color) to guide the light of blue to the photoelectric conversion portion PDb. With this structure, the reflectivity to blue (B) can be increased with use of the dichroic filter DF (the multi-layer interference filter 20r) (see FIG. 16B), and the sensitivity to red (the first color) and the sensitivity to blue (the second color) can each be improved compared with the first embodiment. As to the sensitivity to green (the third color), similar level to that in the first embodiment can be secured because the organic photoelectric conversion film PEg has two photoelectric conversion portions PDr, PDb worth of area. Further, with this structure, the read-out pixel signal amount can be doubled, so that sensitivity can be improved over all.

Figure 18:
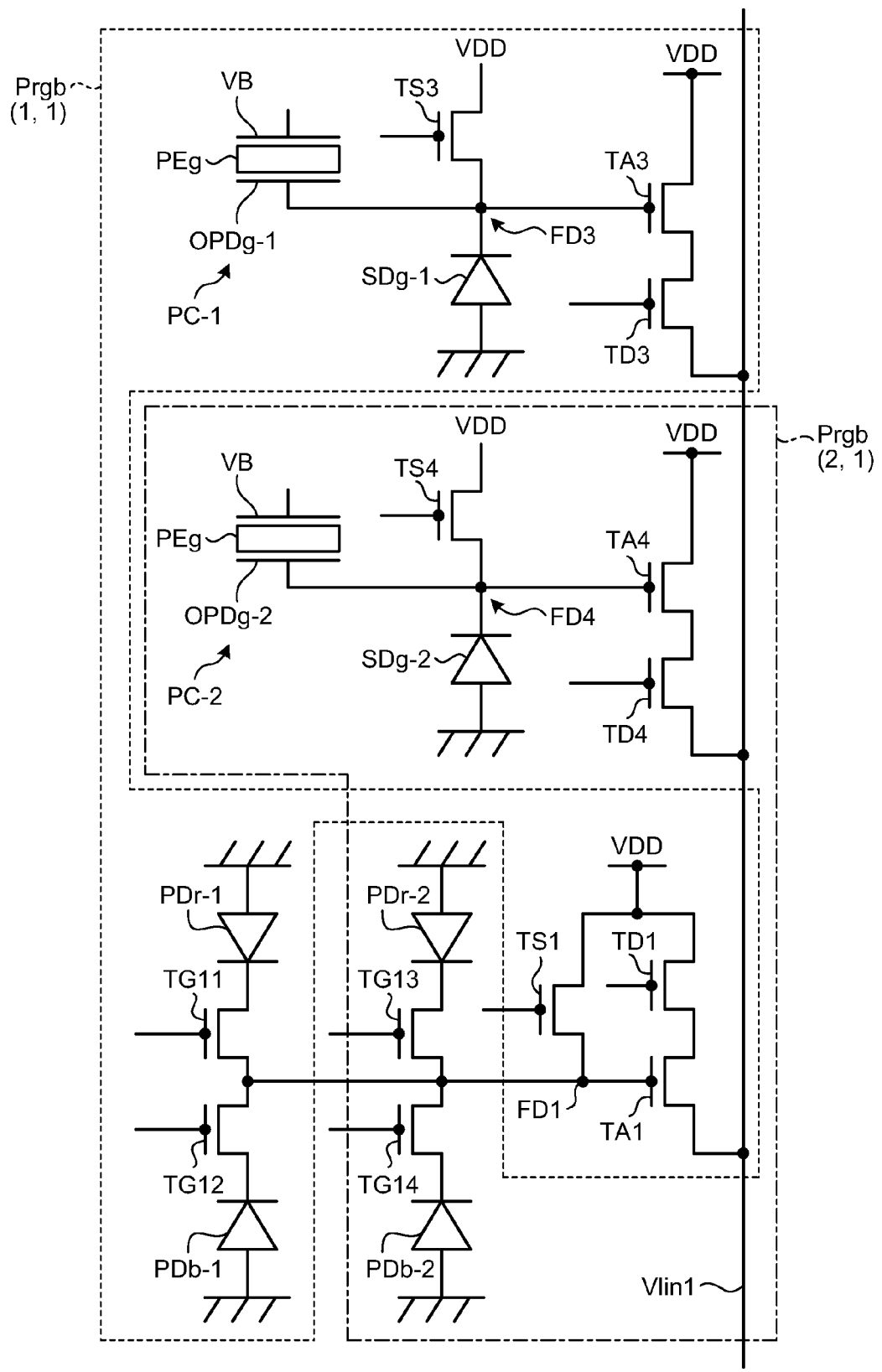
FIG. 18 is a diagram showing the circuit configuration of a pixel in the second embodiment.

For example, the circuit configuration of each pixel is different than in the first embodiment in the following points as shown in FIG. 18. FIG. 18 is a diagram showing the circuit configuration of each pixel.

The two pixels Prgb(1, 1), Prgb(2, 1) connected to the same signal line Vlin1 will be described illustratively. The pixel Prgb(1, 1) has a photoelectric conversion portion PDr-1 instead of the photoelectric conversion portion PDg (see FIG. 6), and the pixel Prgb(2, 1) has a photoelectric conversion portion PDr-2 instead of the photoelectric conversion portion PDg (see FIG. 6). The pixels Prgb(1, 1) and Prgb(2, 1) have the charge voltage conversion portion FD1, the reset portion TS1, the selection portion TD1, and the amplification portion TA1 (see FIG. 6) in common. Photoelectric conversion portions PDr-1, PDb-1, PDr-2, PDb-2 are connected to the charge voltage conversion portion FD1 via transfer portions TG11, TG12, TG13, TG14 respectively.

In the two pixels Prgb(1, 1), Prgb(2, 1), by putting the transfer portions TG11, TG13 in an active state with keeping the transfer portions TG12, TG14 in a non-active state, charge of the photoelectric conversion portion PDr-1 and charge of the photoelectric conversion portion PDr-2 are added in the charge voltage conversion portion FD1, and the added result is converted into a voltage. Then, two pixels worth of a pixel signal of light of the first color (e.g., red) can be output via the amplification portion TA1 onto the signal line Vlin1. Then, after the voltage on the charge voltage conversion portion FD1 is reset by the reset portion TS1, by putting the transfer portions TG12, TG14 in the active state with keeping the transfer portions TG11, TG13 in the non-active state, charges of the photoelectric conversion portion PDb-1 and charges of the photoelectric conversion portion PDb-2 are added in the charge voltage conversion portion FD1, and the added result is converted into a voltage. Then, two pixels worth of a pixel signal of light of the second color (e.g., blue) can be output via the amplification portion TA1 onto the signal line Vlin1.

Thus, in the two pixels Prgb(1, 1), Prgb(2, 1), the pixel signal of two photoelectric conversion portions for red and the pixel signal of two photoelectric conversion portions for blue can each be read out. That is, two pixels worth of a pixel signal can be read out for each of red and blue.

The pixel Prgb(1, 1) further has a photoelectric conversion portion PC-1, a charge holding portion SDg-1, a charge voltage conversion portion FD3, a reset portion TS3, a selection portion TD3, and an amplification portion TA3.

The photoelectric conversion portion PC-1 generates charges according to the amount of light of, e.g., the third color (e.g., green) to transfer to the charge holding portion SDg-1. The photoelectric conversion portion PC-1 has the common electrode film VB, the organic photoelectric conversion film PEg, and the pixel electrode film OPDg-1.

The charge holding portion SDg-1 holds the transferred charges. The charge holding portion SDg-1 is, for example, a storage diode.

The charge voltage conversion portion FD3 converts the charge held in the charge holding portion SDg-1 to a voltage. The charge voltage conversion portion FD3 is, for example, a floating diffusion.

The reset portion TS3 resets the voltage across the charge holding portion SDg-1. The reset portion TS3 is, for example, a reset transistor and when a control signal of an active level is supplied to the gate, turns on to reset the voltage across the charge holding portion SDg-1 and when the control signal of a non-active level is supplied to the gate, turns off not to reset the voltage across the charge holding portion SDg-1.

The selection portion TD3 puts the photoelectric conversion portion PC-1 side of the pixel Prgb(1, 1) in a selected state or non-selected state. The selection portion TD3 is, for example, a select transistor and when a control signal of an active level is supplied to the gate, turns on to put the photoelectric conversion portion PC-1 side of the pixel Prgb(1, 1) in the selected state and when the control signal of a non-active level is supplied to the gate, turns off to put the photoelectric conversion portion PC-1 side of the pixel Prgb(1, 1) in the non-selected state. The selection portion TD1 puts the photoelectric conversion portion PDr, PDb side of the pixel Prgb in the selected state or non-selected state.

When the photoelectric conversion portion PC-1 side of the pixel Prgb(1, 1) is in the selected state, the amplification portion TA3 outputs a signal corresponding to the voltage across the charge holding portion SDg-1 onto the signal line Vlin1. The amplification portion TA3 is, for example, an amplification transistor and when the photoelectric conversion portion PC-1 side of the pixel Prgb(1, 1) is in the selected state, performs source follower operation with a load current source (not shown) connected to the signal line Vlin1 to output a signal corresponding to the voltage across the charge holding portion SDg-1 onto the signal line Vlin1.

In the pixel Prgb(1, 1), a bias is applied across the common electrode film VB and the pixel electrode film OPDg-1, and charge collected accordingly at the pixel electrode film OPDg-1 is transferred to the charge holding portion SDg-1. Thus, the charge of the photoelectric conversion portion PC-1 is converted to a voltage by the charge voltage conversion portion FD3, and the pixel signal of light of the third color (e.g., green) can be output via the amplification portion TA3 onto the signal line Vlin1.

The pixel Prgb(2, 1) further has a photoelectric conversion portion PC-2, a charge holding portion SDg-2, a charge voltage conversion portion FD4, a reset portion TS4, a selection portion TD4, and an amplification portion TA4. In the pixel Prgb(2, 1), a bias is applied across the common electrode film VB and the pixel electrode film OPDg-2, and charge collected accordingly at the pixel electrode film OPDg-2 is transferred to the charge holding portion SDg-2. Thus, the charge of the photoelectric conversion portion PC-2 is converted to a voltage by the charge voltage conversion portion FD4, and the pixel signal of light of the third color (e.g., green) can be output via the amplification portion TA4 onto the signal line Vlin1.

Thus, compared with the basic configuration where one micro-lens ML is provided for each photoelectric conversion portion PD to form one pixel, a doubled amount of a pixel signal can be read out from the organic photoelectric conversion film PEg having two photoelectric conversion portions worth of area in the pixel Prgb(1, 1). Also, a doubled amount of a pixel signal can be read out from the organic photoelectric conversion film PEg having two photoelectric conversion portions worth of area in the pixel Prgb(2, 1).

In this way, compared with the basic configuration where one micro-lens ML is provided for each photoelectric conversion portion PD to form one pixel, in the circuit configuration shown in FIG. 18, two pixels worth of a pixel signal can be read out for each of four colors (R, Gr, B, Gb), which form a unit of the Bayer array.

Figure 19:
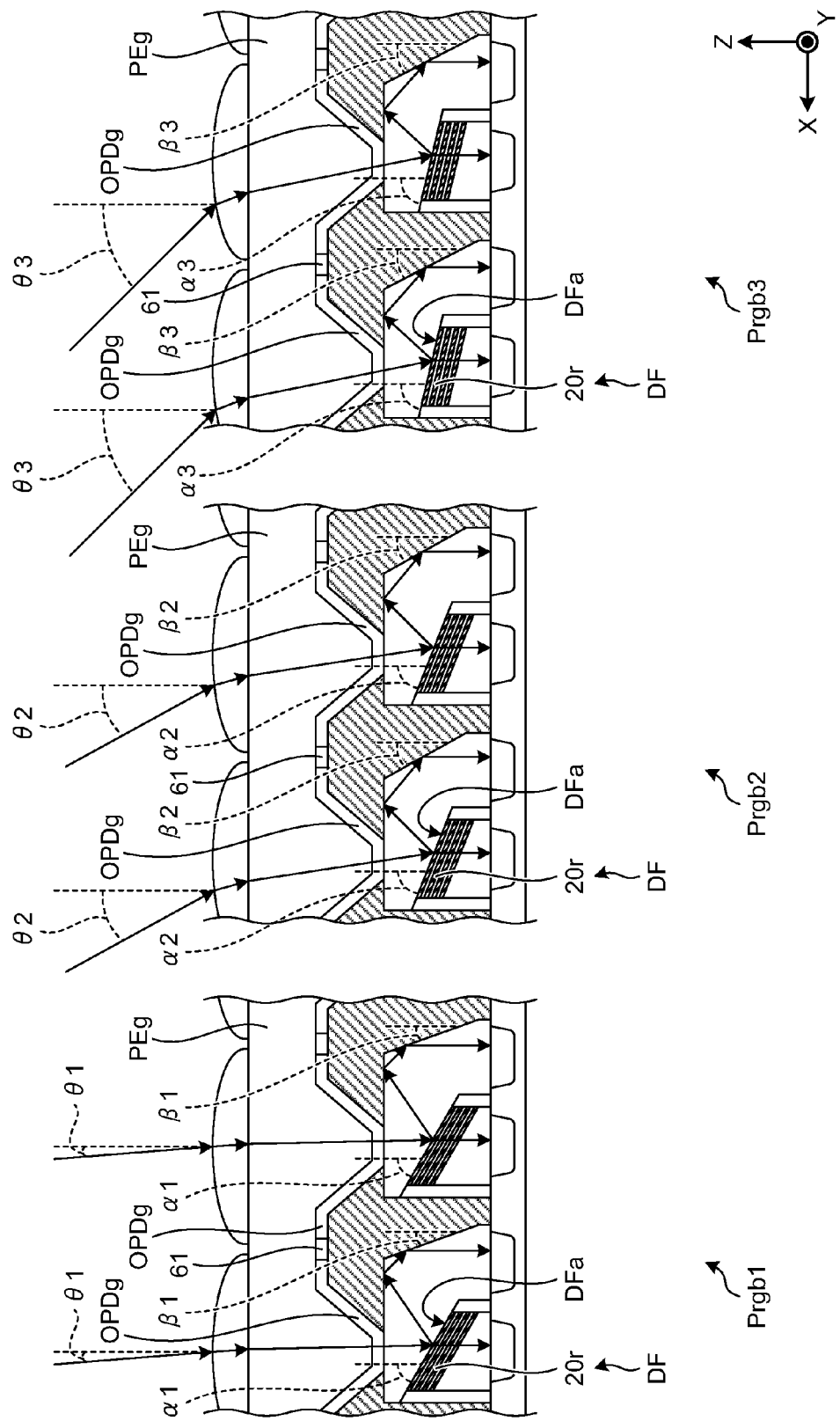
FIG. 19 is a diagram showing the inclination angle of the light incidence surface of the dichroic filter according to the position of a pixel in the second embodiment.

It should be noted that, as shown in FIG. 19, the second embodiment is similar to the first embodiment in that from among the plurality of pixels, the inclination angle relative to the Z axis direction of the light incidence surface DFa of the dichroic filter DF in the pixels of the periphery region PA can be made greater than the inclination angle relative to the Z axis direction of the light incidence surface DFa of the dichroic filter DF in the pixels of the center region CA. FIG. 19 is a diagram showing the inclination angle of the light incidence surface of the dichroic filter according to the position of a pixel. For example, the inclination angle α2 of the light incidence surface DFa of the dichroic filter DF in the pixel Prgb2 of the periphery region PA shown in FIG. 19 can be greater than the inclination angle α1 of the light incidence surface DFa of the dichroic filter DF in the pixel Prgb1 of the center region CA.

Or, as shown in FIG. 19, from among the plurality of pixels, the inclination angle of the light incidence surface DFa of the dichroic filter DF in the pixels of the periphery region PA1 can be made greater than the inclination angle of the light incidence surface DFa of the dichroic filter DF in the pixels of the center region CA. Further, the inclination angle of the light incidence surface DFa of the dichroic filter DF in the pixels of the periphery region PA2 can be made greater than the inclination angle of the light incidence surface DFa of the dichroic filter DF in the pixels of the periphery region PA1. For example, the inclination angle α1 of the light incidence surface DFa of the dichroic filter DF in the pixel Prgb1 of the center region CA, the inclination angle α2 of the light incidence surface DFa of the dichroic filter DF in the pixel Prgb2 of the periphery region PA1, and the inclination angle α3 of the light incidence surface DFa of the dichroic filter DF in the pixel Prgb3 of the periphery region PA2 can be made greater than one another in a multi-stepwise fashion.

A manufacturing method of the solid-state imaging device 205 is different than in the first embodiment in the following points.

After the steps shown in FIG. 9A to FIG. 14B are executed as in the first embodiment, the step shown in FIG. 19 is executed. FIG. 19 is a cross-sectional view showing the configuration of the solid-state imaging device 205 with the contact plug CTP (see FIG. 17) and the common electrode film VB (see FIG. 18) being omitted as needed, but is also used as a process step cross-sectional view showing the manufacturing method.

In the step shown in FIG. 19, the pixel electrode film OPDg covering the metal-film pattern PT and the insulating film pattern 55 (see FIG. 13B) via an insulating film at the interface is formed. The pixel electrode film OPDg is formed of, e.g., material containing transparent conductive material such as ITO or ZnO as a main component. Grooves are formed by lithography so as to divide the pixel electrode film OPDg into respective parts for pixels, and the insulating film 61 is filled into the grooves. Then, the organic photoelectric conversion film PEg is formed over the pixel electrode films OPDg. The organic photoelectric conversion film PEg is formed of an organic substance having the property of absorbing light in the wavelength range of green and transmitting light in the other wavelength ranges. The micro-lenses ML and so on are formed on the organic photoelectric conversion film PEg. Thus, the solid-state imaging device 205 is formed.

As described above, also according to the second embodiment, the light incident angle to the light incidence surface DFa of the dichroic filter DF in the pixels of the periphery region PA can be made close to the light incident angle to the light incidence surface DFa of the dichroic filter DF in the pixels of the center region CA. As a result, the amount of received light of the photoelectric conversion portion (first photoelectric conversion portion) PDr in the pixels of the periphery region PA can be made close to the amount of received light of the photoelectric conversion portion (first photoelectric conversion portion) PDr in the pixels of the center region CA. Therefore, the occurrence of shading in the solid-state imaging device 205 can be suppressed.

Or also according to the second embodiment, the light incident angle to the light incidence surface DFa of the dichroic filter DF in the pixels of the periphery region PA1 and the light incident angle to the light incidence surface DFa of the dichroic filter DF in the pixels of the periphery region PA2 can each be made close to the light incident angle to the light incidence surface DFa of the dichroic filter DF in the pixels of the center region CA. As a result, the amount of received light of the photoelectric conversion portion (first photoelectric conversion portion) PDr in the pixels of the periphery region PA1 and the amount of received light of the photoelectric conversion portion (first photoelectric conversion portion) PDr in the pixels of the periphery region PA2 can each be made close to the amount of received light of the photoelectric conversion portion (first photoelectric conversion portion) PDr in the pixels of the center region CA. Therefore, the occurrence of shading in the solid-state imaging device 205 can be further suppressed.

In the second embodiment, two pixels worth of a pixel signal can be read out for each of four colors (R, Gr, B, Gb), which form a unit of the Bayer array, from two pixels (total: 4×2=8 pixels worth). That is, compared with the basic configuration where one micro-lens ML is provided for each photoelectric conversion portion PD to form one pixel, the sensitivity to each of four colors (R, Gr, B, Gb) can be approximately quadrupled. Thus, the sensitivity to each of four colors (R, Gr, B, Gb) can be easily improved.

Figure 20:
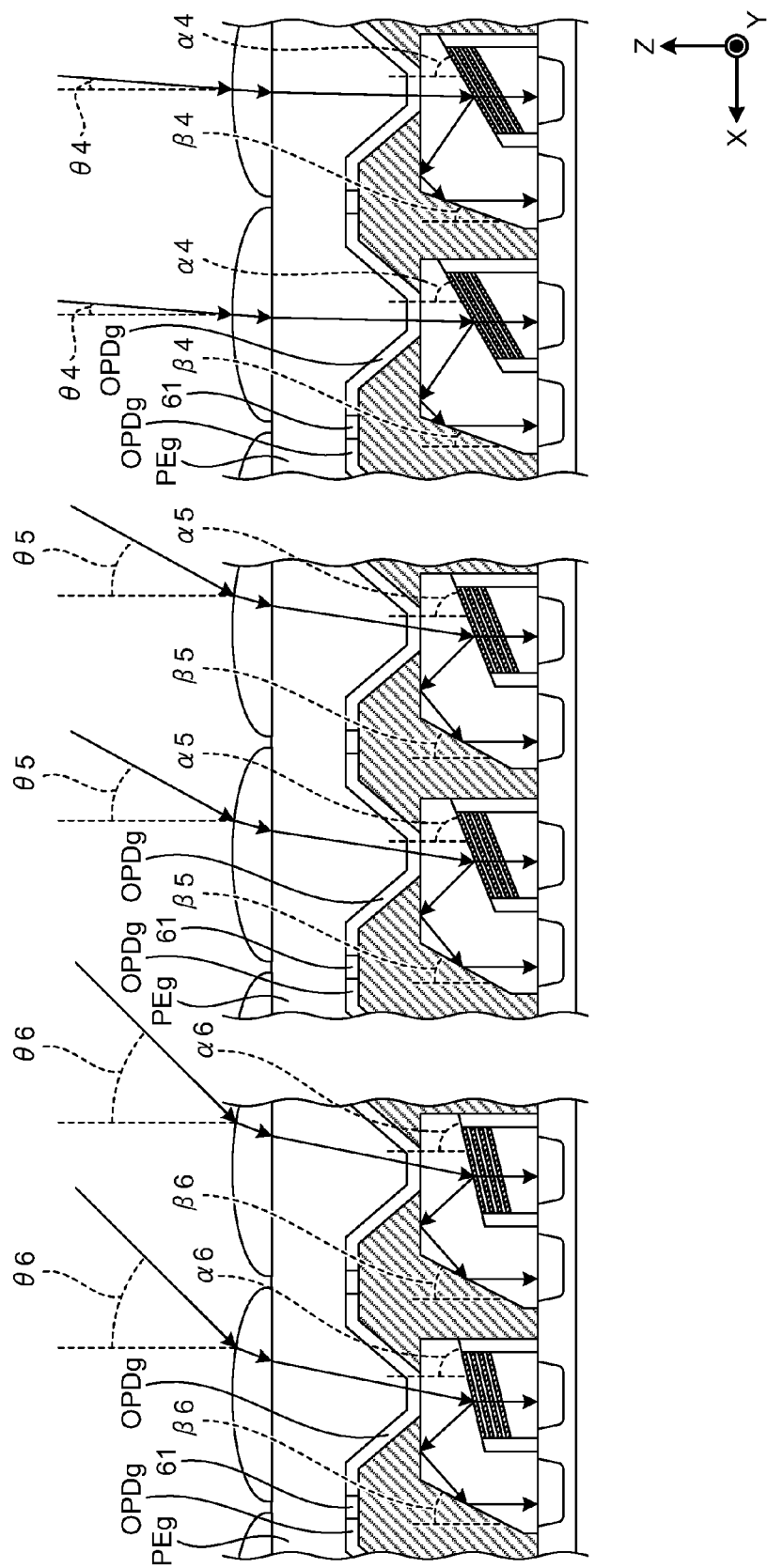
FIG. 20 is a diagram showing the inclination angle of the light incidence surface of the dichroic filter according to the position of a pixel in a modified example of the second embodiment.

It should be noted that, in the solid-state imaging device 205, the inclination orientation of the light incidence surface DFa of the dichroic filter DF may be changed according to the direction in which going farther from the center CP of the imaging region IR. That is, as shown in FIG. 20, from among the plurality of pixels, the inclination orientations of the light incidence surfaces DFa of the dichroic filters DF in pixels located on opposite sides of the center CP of the imaging region IR may be made opposite. FIG. 20 is a diagram showing the inclination angle of the light incidence surface DFa of the dichroic filter DF according to the position of a pixel. Because details thereof are similar to that in the modified example of the first embodiment, description is omitted.

Figure 22:
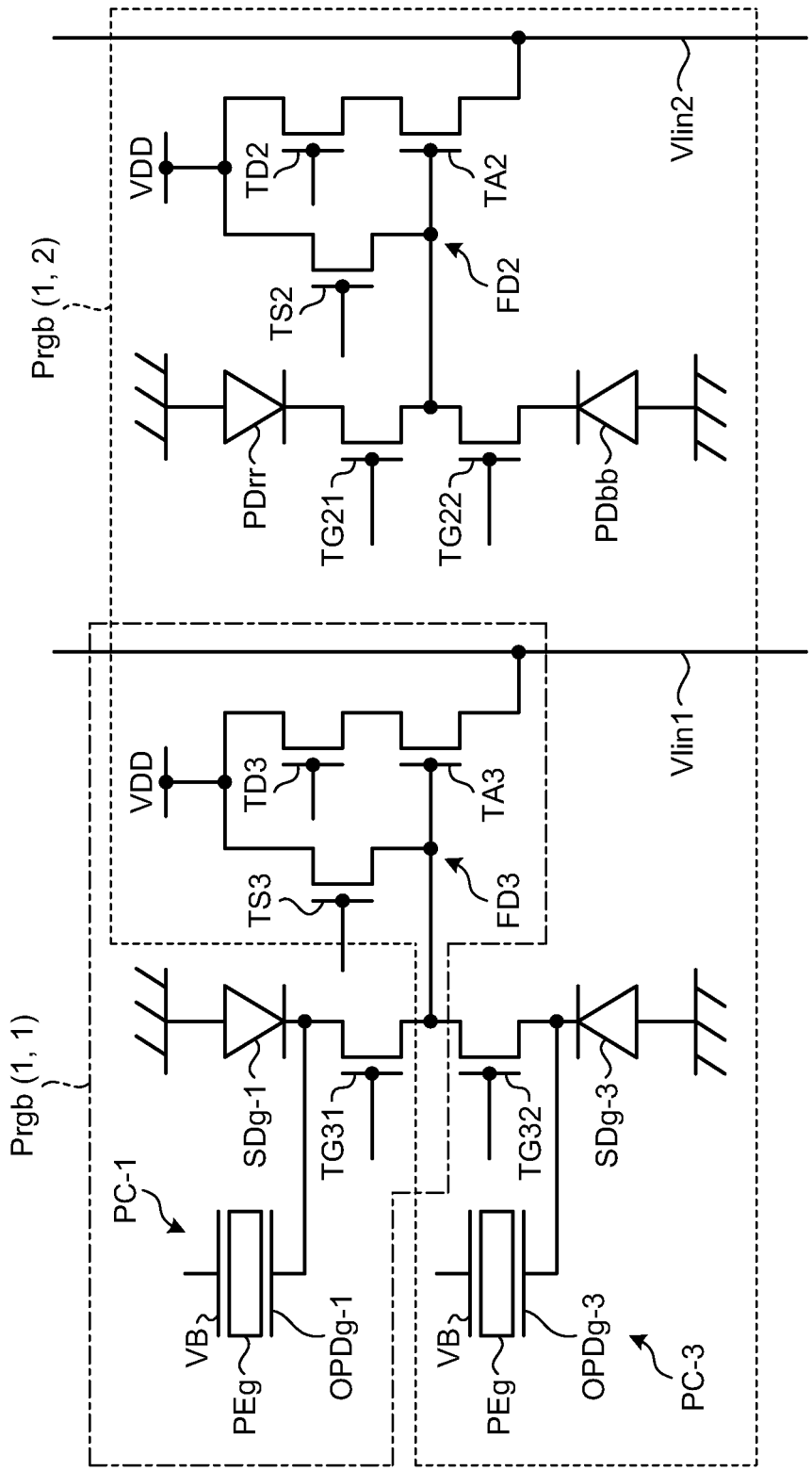
FIG. 22 is a diagram showing the circuit configuration of a pixel in the other modified example of the second embodiment.

Alternatively, although in the second embodiment with the light receiving area of the organic photoelectric conversion film PEg being about twice the light receiving area of each photoelectric conversion portion PDr, PDb, respective charge of two photoelectric conversion portions (two pixels worth of charge in total) are added and read out for each photoelectric conversion portion PDr, PDb, instead two photoelectric conversion portions may be electrically connected as shown in FIG. 21D. FIG. 21A to 21D is a diagram showing the arrangement of multiple pixels Prgb in a modified example. For example, the circuit may be configured such that, with the photoelectric conversion portion PDr of pixel Prgb(1, 1) and the photoelectric conversion portion PDr of pixel Prgb(1, 2) (see FIG. 17D) being electrically connected to form a photoelectric conversion portion PDrr, a signal according to charge of the photoelectric conversion portion PDrr is read out from the pixel Prgb(1, 2). The circuit may be configured such that, with the photoelectric conversion portion PDb of pixel Prgb (1, 2) and the photoelectric conversion portion PDb of pixel Prgb(2, 3) (see FIG. 17D) being electrically connected to form a photoelectric conversion portion PDbb, a signal according to charge of the photoelectric conversion portion PDbb is read out from the pixel Prgb(1, 2). Thus, as shown in FIG. 22, the circuit configuration for reading out pixel signals of four colors (R, Gr, B, Gb), which form a unit of the Bayer array, can be simplified. FIG. 22 is a diagram showing the circuit configuration of each pixel in the modified example.

Two pixels Prgb(1, 1), Prgb(1, 2) connected to different signal lines Vlin1, Vlin2 will be described illustratively. The pixel Prgb(1, 1) does not have the photoelectric conversion portions PDr-1, PDb-1, transfer portions TG11, TG12, charge voltage conversion portion FD1, reset portion TS1, selection portion TD1, and amplification portion TA1 (see FIG. 18), but further has a transfer portion TG31. The pixel Prgb(1, 2) has photoelectric conversion portions PDrr, PDbb instead of photoelectric conversion portions PDg, PDr (see FIG. 6) and further has a photoelectric conversion portion PC-3, a charge holding portion SDg-3, a transfer portion TG32, a charge voltage conversion portion FD3, a reset portion TS3, a selection portion TD3, and an amplification portion TA3. The pixels Prgb(1, 1) and Prgb(1, 2) have the charge voltage conversion portion FD3, reset portion TS3, selection portion TD3, and amplification portion TA3 in common.

Thus, compared with the basic configuration where one micro-lens ML is provided for each photoelectric conversion portion PD to form one pixel, two green pixels worth of a pixel signal can be read out from the organic photoelectric conversion film PEg having two pixels worth of area in the pixel Prgb(1, 1). Also, two green pixels worth of a pixel signal can be read out from the organic photoelectric conversion film PEg having two pixels worth of area in the pixel Prgb(1, 2).

Further, the pixel signal of the photoelectric conversion portion PDrr having two red photoelectric conversion portions PD worth of area in the pixel Prgb(1, 2) and the pixel signal of the photoelectric conversion portion PDbb having two blue photoelectric conversion portions PD worth of area can each be read out. That is, compared with the basic configuration where one micro-lens ML is provided for each photoelectric conversion portion PD to form one pixel, a doubled amount of a pixel signal can be read out for each of red and blue.

In this way, also with the circuit configuration shown in FIG. 22, compared with the basic configuration where one micro-lens ML is provided for each photoelectric conversion portion PD to form one pixel, two pixels worth of a pixel signal can be read out for each of four colors (R, Gr, B, Gb), which form a unit of the Bayer array.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising an imaging region where a plurality of pixels are arranged two-dimensionally, each of the plurality of pixels corresponding to at least two colors, wherein each of the plurality of pixels includes:
a first photoelectric conversion portion;
a second photoelectric conversion portion;
a micro-lens; and
a dichroic filter that transmits light of a first color out of light having passed through the micro-lens to guide the light of the first color to the first photoelectric conversion portion and reflects light of a second color to guide the light of the second color to the second photoelectric conversion portion, and wherein a first inclination angle of a light incidence surface of the dichroic filter in a first pixel among the plurality of pixels relative to a normal to a surface of a semiconductor substrate and a second inclination angle of a light incidence surface of the dichroic filter in a second pixel located farther from a center of the imaging region than the first pixel among the plurality of pixels relative to the normal are set on so as to make, for light incident on the imaging region, a filter property of the dichroic filter in the first pixel and a filter property of the dichroic filter in the second pixel equalized.

2. The solid-state imaging device according to claim 1, wherein
the dichroic filter in each of the plurality of pixels has a light incidence surface inclined at an angle relative to the normal to the surface of the semiconductor substrate.

3. The solid-state imaging device according to claim 2, wherein
the dichroic filter in each of the plurality of pixels further has a light exit surface that emits light having passed through and that is substantially parallel to the light incidence surface.

4. The solid-state imaging device according to claim 1, wherein
the second inclination angle is greater than the first inclination angle.

5. The solid-state imaging device according to claim 4, wherein
a third inclination angle relative to the normal of a light incidence surface of the dichroic filter in a third pixel located farther from the center of the imaging region than the second pixel among the plurality of pixels is greater than the second inclination angle.

6. The solid-state imaging device according to claim 1, wherein
a light incidence surface of the dichroic filter in a fourth pixel located on an opposite side of the center of the imaging region from the first pixel and in a position corresponding to the first pixel among the plurality of pixels is inclined in a direction opposite to the light incidence surface of the dichroic filter in the first pixel with respect to the normal,
a light incidence surface of the dichroic filter in a fifth pixel located on the opposite side of the center of the imaging region from the second pixel and in a position corresponding to the second pixel among the plurality of pixels is inclined in a direction opposite to the light incidence surface of the dichroic filter in the second pixel with respect to the normal, and
an absolute value of a fifth inclination angle of the light incidence surface of the dichroic filter in the fifth pixel relative to the normal is greater than an absolute value of a fourth inclination angle of the light incidence surface of the dichroic filter in the fourth pixel relative to the normal.

7. The solid-state imaging device according to claim 6, wherein the absolute value of the fourth inclination angle is substantially equal to an absolute value of the first inclination angle, and the absolute value of the fifth inclination angle is substantially equal to an absolute value of the second inclination angle.

8. The solid-state imaging device according to claim 7, wherein
a third inclination angle relative to the normal of a light incidence surface of the dichroic filter in a third pixel located farther from the center of the imaging region than the second pixel among the plurality of pixels is greater than the second inclination angle,
a light incidence surface of the dichroic filter in a sixth pixel located on the opposite side of the center of the imaging region from the third pixel and in a position corresponding to the third pixel among the plurality of pixels is inclined in a direction opposite to the light incidence surface of the dichroic filter in the third pixel with respect to the normal, and
an absolute value of a sixth inclination angle of the light incidence surface of the dichroic filter in the sixth pixel relative to the normal is greater than the absolute value of the fifth inclination angle.

9. The solid-state imaging device according to claim 8, wherein
the absolute value of the sixth inclination angle is substantially equal to an absolute value of the third inclination angle.

10. The solid-state imaging device according to claim 2, wherein
each of the plurality of pixels further includes a reflective structure that has a reflective surface inclined relative to the normal correspondingly to the light incidence surface of the dichroic filter and that reflects light of the second color reflected by the dichroic filter to guide the light of the second color to the second photoelectric conversion portion.

11. The solid-state imaging device according to claim 10, wherein
the second inclination angle is greater than the first inclination angle, and
a seventh inclination angle relative to the normal of an inclined reflective surface in the second pixel is greater than an eighth inclination angle relative to the normal of an inclined reflective surface in the first pixel.

12. The solid-state imaging device according to claim 1, wherein
each of the plurality of pixels further includes an organic color filter that is arranged between the micro-lens and the dichroic filter and that selectively transmits light of the first color and light of the second color out of light having passed through the micro-lens.

13. The solid-state imaging device according to claim 1, wherein
each of the plurality of pixels corresponds to three colors and further includes an organic photoelectric conversion film that photo-electrically converts light of a third color different from light of the first color and light of the second color out of light having passed through the micro-lens.

14. The solid-state imaging device according to claim 13, wherein
a light receiving area of the organic photoelectric conversion film is approximately twice a light receiving area of each of the first photoelectric conversion portion and the second photoelectric conversion portion.

15. The solid-state imaging device according to claim 14, wherein
light of the first color is of a longer wavelength than light of the third color, and
light of the second color is of a shorter wavelength than light of the third color.

16. The solid-state imaging device according to claim 1, wherein
the dichroic filter includes a multi-layer interference filter in which first layers and second layers having different refractive index from each other are alternately stacked one over another.

17. The solid-state imaging device according to claim 16, wherein
the dichroic filter further includes an insulating film covering side surfaces of the multi-layer interference filter.

18. The solid-state imaging device according to claim 17, wherein
the insulating film has different refractive index from the first layers and the second layers of the dichroic filter.

19. A manufacturing method of a solid-state imaging device which has an imaging region where a plurality of pixels including at least a first pixel and a second pixel are arranged two-dimensionally, each of the plurality of pixels corresponding to at least two colors,
the manufacturing method including:
forming a plurality of photoelectric conversion portion groups each including first and second photoelectric conversion portions in a semiconductor substrate;
forming a plurality of dichroic filters above a plurality of first photoelectric conversion portions; and
forming a plurality of micro-lenses above the plurality of dichroic filters, and
forming a plurality of inclined surface patterns in positions corresponding to the plurality of dichroic filters prior to the forming of the plurality of dichroic filters, the plurality of dichroic filters being provided along the plurality of inclined surface patterns;
wherein the forming of the plurality of inclined surface patterns includes:
forming an insulating film over the plurality of photoelectric conversion portion groups; and
patterning the insulating film using a grating mask such that an inclination angle of the inclined surface pattern corresponding to the second pixel located farther from a center of the imaging region than the first pixel of the plurality of pixels relative to a normal to a surface of the semiconductor substrate is greater than an inclination angle of the inclined surface pattern corresponding to the first pixel of the plurality of pixels relative to the normal.

20. The manufacturing method of the solid-state imaging device according to claim 19, wherein
the forming of the plurality of dichroic filters includes laying first layers and second layers having different refractive index from each other alternately stacked one over another to be along the plurality of inclined surface patterns, thereby forming a plurality of multi-layer interference filters.

* * * * *